United States Patent
Nozaki

(10) Patent No.: US 11,875,832 B2
(45) Date of Patent: Jan. 16, 2024

(54) SPINTRONICS DEVICE, MAGNETIC MEMORY, AND ELECTRONIC APPARATUS

(71) Applicant: KEIO UNIVERSITY, Tokyo (JP)

(72) Inventor: Yukio Nozaki, Yokohama (JP)

(73) Assignee: KEIO UNIVERSITY, Tokyo (JP)

( * ) Notice: Subject to any disclaimer, the term of this patent is extended or adjusted under 35 U.S.C. 154(b) by 496 days.

(21) Appl. No.: 17/273,202

(22) PCT Filed: Sep. 4, 2019

(86) PCT No.: PCT/JP2019/034831
§ 371 (c)(1),
(2) Date: Mar. 3, 2021

(87) PCT Pub. No.: WO2020/050329
PCT Pub. Date: Mar. 12, 2020

(65) Prior Publication Data
US 2021/0327485 A1    Oct. 21, 2021

(30) Foreign Application Priority Data
Sep. 5, 2018    (JP) .................. 2018-165900

(51) Int. Cl.
| | | |
|---|---|---|
| *H01L 29/82* | (2006.01) | |
| *G11C 11/16* | (2006.01) | |
| *H10B 61/00* | (2023.01) | |
| *H10N 50/10* | (2023.01) | |
| *H10N 50/85* | (2023.01) | |
| *H10N 52/80* | (2023.01) | |

(52) U.S. Cl.
CPC ............ *G11C 11/161* (2013.01); *H10B 61/20* (2023.02); *H10N 50/10* (2023.02); *H10N 50/85* (2023.02); *H10N 52/80* (2023.02)

(58) Field of Classification Search
CPC ... G11C 11/161; G11C 11/1675; H10B 61/20; H10B 99/00; H10N 52/80; H10N 50/85; H10N 50/10; H01L 27/105; H01L 29/82
See application file for complete search history.

(56) References Cited

FOREIGN PATENT DOCUMENTS

| | | | |
|---|---|---|---|
| JP | 2014-86448 | * | 5/2014 |
| JP | 2014-086448 A | | 5/2014 |
| JP | 2017-059594 A | | 3/2017 |

(Continued)

OTHER PUBLICATIONS

International Search Report dated Nov. 5, 2019 corresponding to International Patent Application No. PCT/JP2019/034831.

(Continued)

*Primary Examiner* — Niki H Nguyen
(74) *Attorney, Agent, or Firm* — SQUIRE PATTON BOGGS (US) LLP

(57) ABSTRACT

Provided are a spintronics device, a magnetic memory, and an electronics device capable of generating a large spin current without depending on a specific material. A spintronics device includes a first conductive layer, a second conductive layer having carrier mobility or electrical conductivity lower than that of the first conductive layer, and a boundary region between the conductive layers. The boundary region has a gradient of carrier mobility or electrical conductivity, and a spin current is generated by rotation of a velocity field of an electron caused by the gradient.

34 Claims, 26 Drawing Sheets

(56) References Cited

FOREIGN PATENT DOCUMENTS

| JP | 2017-112365 A | | 6/2017 |
|---|---|---|---|
| JP | 2017-216365 | * | 6/2017 |
| JP | 2017-216286 | * | 7/2017 |
| JP | 2017-216286 A | | 12/2017 |
| WO | 2017018391 A1 | | 2/2017 |
| WO | WO 2018/155077 A1 | | 8/2018 |
| WO | WO 2018/155078 A1 | | 8/2018 |

OTHER PUBLICATIONS

Mizukami et al., "The study on ferromagnetic resonance linewidth for NM/80NiFe/NM (NM=Cu, Ta, Pd and Pt) films," Japanese Journal of Applied Physics, 40(2A), 2001, p. 580-p. 585.
Urban et al., "Gilbert Damping in Single and Multilayer Ultrathin Films: Role of Interfaces in Nonlocal Spin Dynamics," Physical Review Letters, 2001 vol. 87, p. 217204-1-p. 217204-4.
Kato et al., "Observation of the spin Hall effect in semiconductors," Science, 2004, vol. 306, p. 1910-p. 1913.
Kimura et al., "Room-temperature reversible spin Hall effect," Physical Review Letters, 2007 vol. 98, p. 156601-1-p. 156601-4.
Chen et al., "Spin-torque and spin-Hall nano-oscillators," Proceedings, IEEE, 2016, vol. 104, p. 1919-p. 1945.
An et al., "Spin-torque generator engineered by natural oxidation of Cu," Nature Communications, 2016, 13069, p. 1-p. 8.
International Preliminary Report on Patentability (IPRP) dated Mar. 18, 2021 corresponding to International Patent Application No. PCT/JP2019/034831.

* cited by examiner (a)

| No.   | Materials        | $\theta_{SHE}$ |
|-------|------------------|--------|
| Sam.1 | NiFe(5)/Pt(10)   | 0.064  |
| Sam.2 | Pt(10)/NiFe(5)   | 0.064  |
| Sam.3 | NiFe(5)/Cu*(10)  | 0.039  |
| Sam.4 | Cu(10)/NiFe(5)   | 0.0035 |

| No. | Materials | $\theta_{JsJc}$ |
|---|---|---|
| Sam.1 | NiFe(5)/Pt(10) | 0.064 |
| Sam.2 | Pt(10)/NiFe(5) | 0.064 |
| Sam.3 | NiFe(5)/Cu*(10) | 0.0040 |
| Sam.4 | Cu(10)/NiFe(5) | 0.0035 |

(a)

(b)

(a)

(b)

(a)

(b)

(a)

(b)

SPINTRONICS DEVICE, MAGNETIC MEMORY, AND ELECTRONIC APPARATUS

TECHNICAL FIELD

The present disclosure relates to a spintronics device, a magnetic memory, and an electronics device. This application is based upon and claims the benefit of priority from Japanese Patent Application No. 2018-165900, filed on Sep. 5, 2018; the entire contents of (or all of) which are incorporated herein by reference.

BACKGROUND ART

Non-Patent Documents 1 and 2 disclose studies on a diffusion motion of spins derived from a magnetization dynamics of a magnetic substance. Non-Patent Documents 3 and 4 disclose studies on a relativistic effect of an upspin and a downspin scattering in opposite directions in precious metal such as platinum (Pt).

CITATION LIST

Non Patent Document

Non-Patent Document 1: Mizukami et al., "The study on ferromagnetic resonance linewidth for NM/80NiFe/NM (NM=Cu, Ta, Pd and Pt) films", Japanese Journal of Applied Physics, 40(2A), p. 580, (2001)

Non-Patent Document 2: Urban et al., "Gilbert Damping in Single and Multilayer Ultrathin Films: Role of Interfaces in Nonlocal Spin Dynamics", Physical Review Letters, Volume 87, 217204, (2001)

Non-Patent Document 3: Kato et al., "Observation of the spin Hall effect in semiconductors", Science, Volume 306, pp. 1910-1913 (2004)

Non-Patent Document 4: Kimura et al., "Room-temperature reversible spin Hall effect", Physical Review Letters, Volume 98, 156601 (2007)

Non-Patent Document 5: Chen et al., "Spin-torque and spin-Hall nano-oscillators", Proceedings, IEEE, Volume 104, pp. 1919-1945 (2016)

Non-Patent Document 6: An et al., "Spin-torque generator engineered by natural oxidation of Cu" Nature Communications, 7, 13069 (2016)

SUMMARY OF INVENTION

Technical Problem

A spin current is a flow of spin angular momentum without involving electric charges and can be widely used for controlling various spintronics devices. Since the spin current does not involve the electric charges, the energy consumption of an electronic device can be significantly reduced by not generating Joule heat. The spin current can more efficiently exert a torque on magnetization than the Oersted magnetic field. There is a possibility that the spin current dramatically improves the performance of an electronic device such as a transistor, a random access memory, or a logic gate which faces a principle limit of high performance due to miniaturization.

A spin current generation theory of the related art is based on the spin orbit interaction (SOI) present in a substance. The SOI is a substance-specific phenomenon and is known to be large in rare earth metal with a large atomic number such as platinum, tantalum, tungsten, or bismuth. Accordingly, the material used is limited, and thus, further improvement of spin current intensity is suppressed.

An object of the present disclosure is to provide a spintronics device, a magnetic memory, and an electronics device capable of generating a large spin current without depending on a specific material.

Solution to Problem

A spintronics device according to one embodiment includes a region having a gradient of carrier mobility or electrical conductivity. A spin current is generated by rotation of a velocity field of an electron caused by the gradient. In general, in a case where a voltage is applied to a material containing free electrons, when one electron is focused on, the electron repeatedly accelerates and decelerates while colliding with a scatterer in the material, and travels in a voltage application direction in the material while moving in a zigzag manner. When the movement of the electron is observed on a large scale in time and space, it can be understood that an electron group moves uniformly in one direction. The movement of electric charges by this flow of the electrons generates an electric current.

When a voltage is applied to a region having a gradient of carrier mobility or electrical conductivity, the electron travels while colliding with the scatterer, but a moving velocity of the electron moving in a region having high carrier mobility or electrical conductivity is faster than a moving velocity of the electron moving in a region having low carrier mobility or electrical conductivity. That is, unlike in a normal material having uniform carrier mobility or electrical conductivity, a distribution in which the moving velocities of the electrons are not uniform occurs in the region having the gradient of the carrier mobility or electrical conductivity. At this time, focusing on a minute region in the region, it can be considered that a velocity field (vector field) of the electron is rotating in the minute region due to a difference between the moving velocities of the electrons. A magnitude of rotation of this velocity field can also be regarded as vorticity. Due to the rotation of this velocity field, "angular momentum" is present in a flow of a plurality of electrons in the region. This angular momentum is converted into a spin (upspin or downspin) in one direction. An equilibrium state between upspins and downspins is disturbed so that a relative distribution of the upspins and the downspins is biased. As a result, the spin current is generated in a direction in which the bias of the distribution is eliminated.

In accordance with the findings of the present inventor, it is possible to generate a large spin current substantially equal to or larger than the spin current based on, for example, SOI by the above action. The above-mentioned action is exhibited by merely forming the gradient of the carrier mobility or electrical conductivity, and a special material such as noble metal (for example, Pt) that causes the SOI is not required. Accordingly, regardless of the magnitude of the SOI, metal such as copper (Cu), aluminum (Al), iron (Fe), or platinum (Pt), conductive oxide such as indium oxide ($In_2O_3$), conductive nitride such as titanium nitride (TiN), conductive polymer such as polyacetylene, and a semiconductor such as silicon (Si) can be used for spin current generation. That is, in accordance with the above-mentioned spintronics device, the spin current can be generated regardless of the presence or absence of magnetism or SOI.

The spintronics device may further include a first conductive layer, and a second conductive layer having carrier mobility or electrical conductivity lower than the carrier mobility or electrical conductivity of the first conductive layer. The region may be a boundary region between the first conductive layer and the second conductive layer. In the boundary region between the first and second conductive layers having carrier mobilities or electrical conductivities different from each other, the gradient of the carrier mobility or electrical conductivity is spontaneously formed due to the diffusion of atoms or the like. Thus, in accordance with this spintronics device, the region having the gradient of the carrier mobility or electrical conductivity can be easily realized.

The spintronics device may not include a ferromagnetic layer adjacent to the first conductive layer. In accordance with the above-mentioned spintronics device, the spin current can be generated by the above-mentioned action even though the ferromagnetic layer is not provided.

In the spintronics device described above, the second conductive layer may contain an oxide of a material constituting the first conductive layer. Accordingly, the second conductive layer having carrier mobility or electrical conductivity lower than that of the first conductive layer can be easily formed. In this case, the first conductive layer may mainly contain copper, and the second conductive layer may mainly contain copper oxide.

In the spintronics device described above, the second conductive layer may be made of another material except for an oxide of a material constituting the first conductive layer. Even in such a case, the above-mentioned spin current generation action can be obtained.

The spintronics device described above may generate the spin current by angular momentum due to the rotation of the velocity field of the electron. Accordingly, the spin current can be generated as described above.

A magnetic memory according to one embodiment includes a first ferromagnetic layer, a non-magnetic layer provided on the first ferromagnetic layer, a second ferromagnetic layer provided on the non-magnetic layer, a first conductive layer provided on the second ferromagnetic layer, and a second conductive layer having carrier mobility or electrical conductivity lower than the carrier mobility or electrical conductivity of the first conductive layer and provided on the first conductive layer. A boundary region between the first conductive layer and the second conductive layer has a gradient of carrier mobility or electrical conductivity in a stacking direction. A spin current is generated by rotation of a velocity field of an electron caused by the gradient. Information is stored by controlling a direction of magnetization of the second ferromagnetic layer by using the spin current. This magnetic memory includes the above-mentioned spintronics device configuration. Thus, the spin current can be generated without depending on the specific material.

A spintronics device according to another embodiment includes a first conductive layer, and a second conductive layer having carrier mobility or electrical conductivity lower than the carrier mobility or electrical conductivity of the first conductive layer. A spin current is generated by rotation of a velocity field of an electron caused by a change in carrier mobility or electrical conductivity at a boundary between the first conductive layer and the second conductive layer. Even when the carrier mobility or electrical conductivity changes discontinuously, the velocity field of the electron rotates due to a difference between the moving velocities of the electrons. "Angular momentum" in the flow of the electrons is generated due to the rotation of this velocity field, and the spin current is generated by the above-mentioned action. Accordingly, even in this spintronics device, a large spin current can be generated. This action is exhibited by merely discontinuously changing the carrier mobility or the electrical conductivity, and a special material such as precious metal that causes the SOI is not required.

A magnetic memory according to another embodiment includes a first ferromagnetic layer, a non-magnetic layer provided on the first ferromagnetic layer, a second ferromagnetic layer provided on the non-magnetic layer, a first conductive layer provided on the second ferromagnetic layer, and a second conductive layer having carrier mobility or electrical conductivity lower than the carrier mobility or electrical conductivity of the first conductive layer and provided on the first conductive layer. A spin current is generated by rotation of a velocity field of an electron caused by a change in carrier mobility or electrical conductivity at a boundary between the first conductive layer and the second conductive layer. Information is stored by controlling a direction of magnetization of the second ferromagnetic layer by using the spin current. This magnetic memory includes the above-mentioned spintronics device configuration. Thus, the spin current can be generated without depending on the specific material.

An electronics device according to one embodiment has one or more of the above magnetic memories mounted thereon. This electronics device includes the configuration of the above-mentioned spintronics device. Thus, the spin current can be generated without depending on the specific material.

A spin torque oscillator according to one embodiment has a ferromagnetic layer, a first conductive layer provided on the ferromagnetic layer, and a second conductive layer having carrier mobility or electrical conductivity lower than that of the first conductive layer and provided on the first conductive layer. A boundary region between the first conductive layer and the second conductive layer has a gradient of carrier mobility or electrical conductivity in a stacking direction, a spin current is generated by rotation of a velocity field of an electron caused by the gradient, and an alternating magnetic field is generated by vibrating a direction of magnetization of the ferromagnetic layer by using the spin current. This spin torque oscillator has the configuration of the above-mentioned spintronics device. Thus, the spin current can be generated without depending on the specific material.

Advantageous Effects of Invention

In accordance with the spintronics device, the magnetic memory, and the electronics device according to the present disclosure, the large spin current can be generated without depending on the specific material. Similarly, in accordance with the spin torque oscillator according to the present disclosure, the large spin current can be generated without depending on the specific material.

Figure 3:
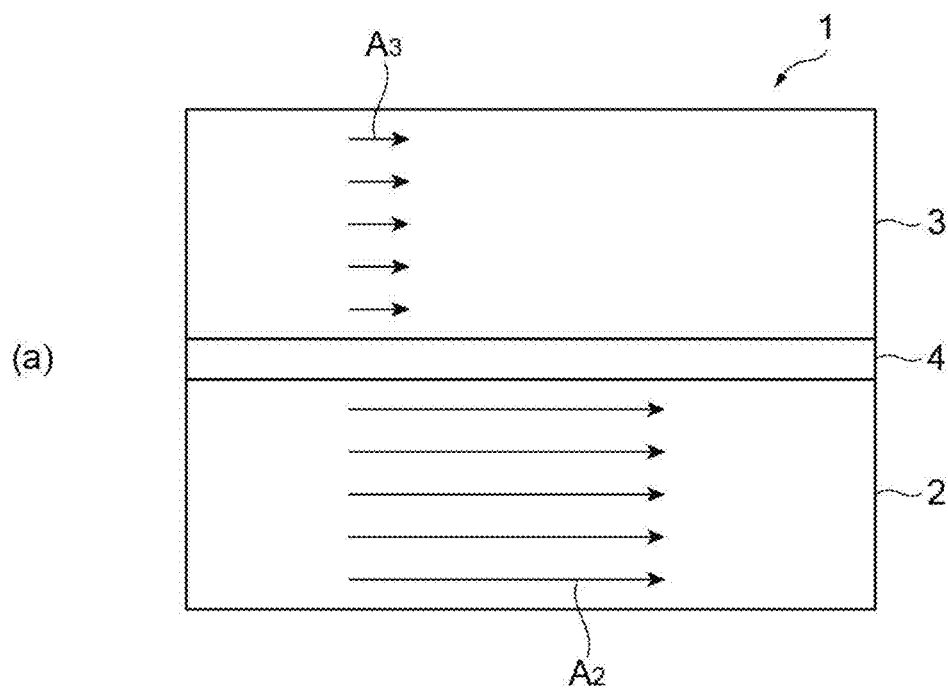
Figure 3:
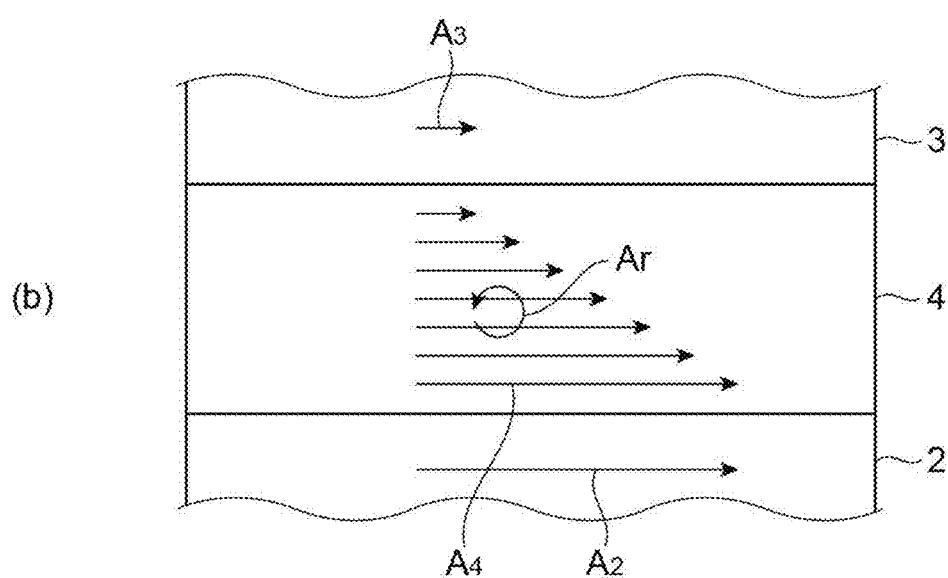

Part (a) and part (b) of FIG. 3 are schematic diagrams showing velocities of electrons moving inside the device 1 when a voltage is applied in a direction intersecting the stacking direction.

Figure 4:
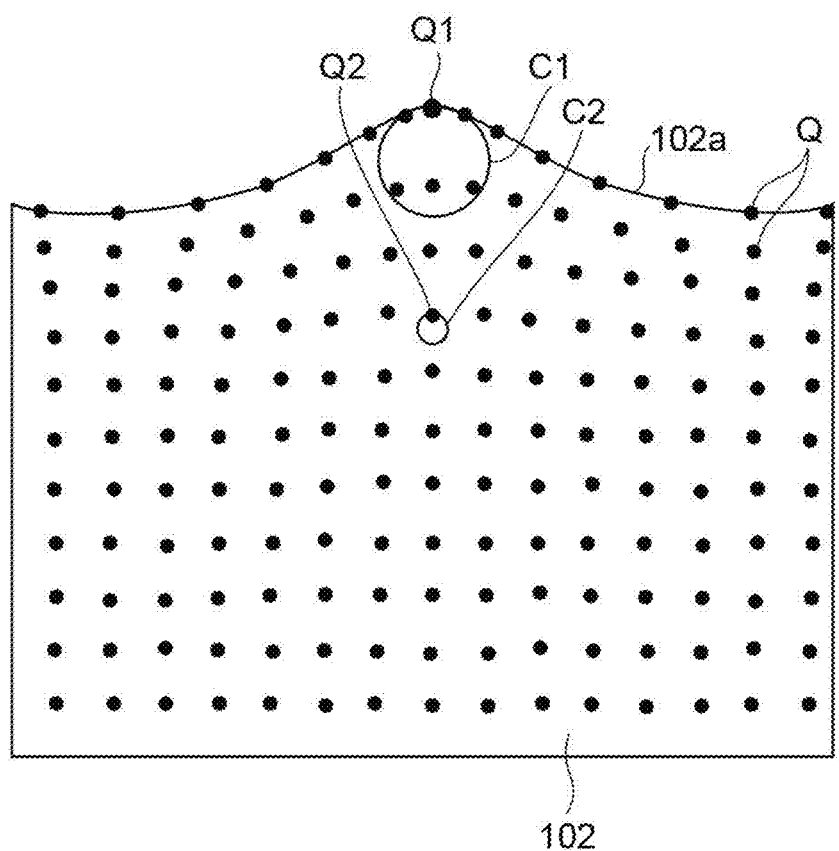

FIG. 4 is a schematic diagram showing a generation mechanism of a spin current by a Rayleigh wave as a reference example.

Figure 5:
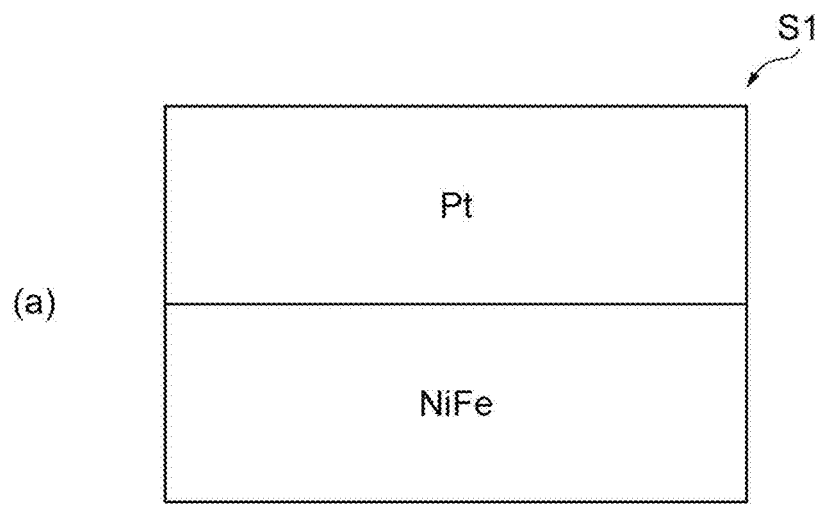
Figure 5:
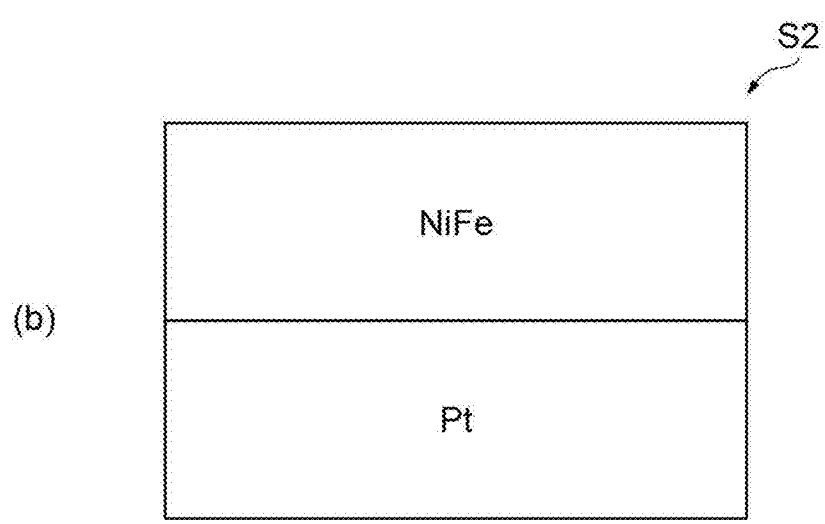

Part (a) of FIG. 5 is a diagram showing a layer structure of a sample S1 prepared for an experiment. Part (b) of FIG. 5 is a diagram showing a layer structure of a sample S2 prepared for the experiment.

Figure 6:
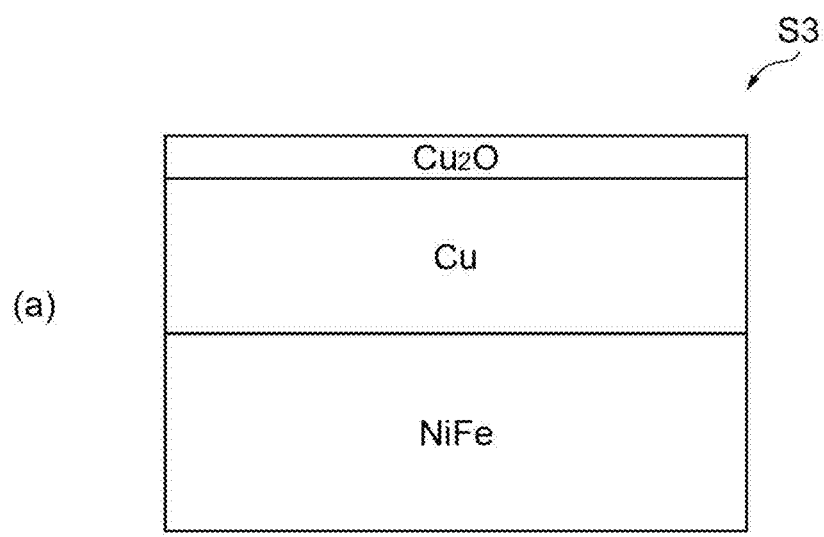
Figure 6:
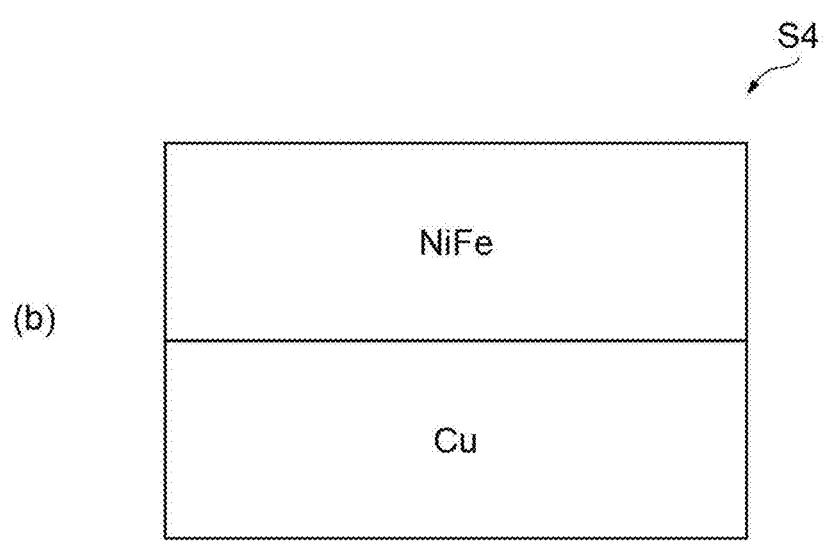

Part (a) of FIG. 6 is a diagram showing a layer structure of a sample S3 prepared for the experiment. Part (b) of FIG. 6 is a diagram showing a layer structure of a sample S4 prepared for the experiment.

Figure 7:
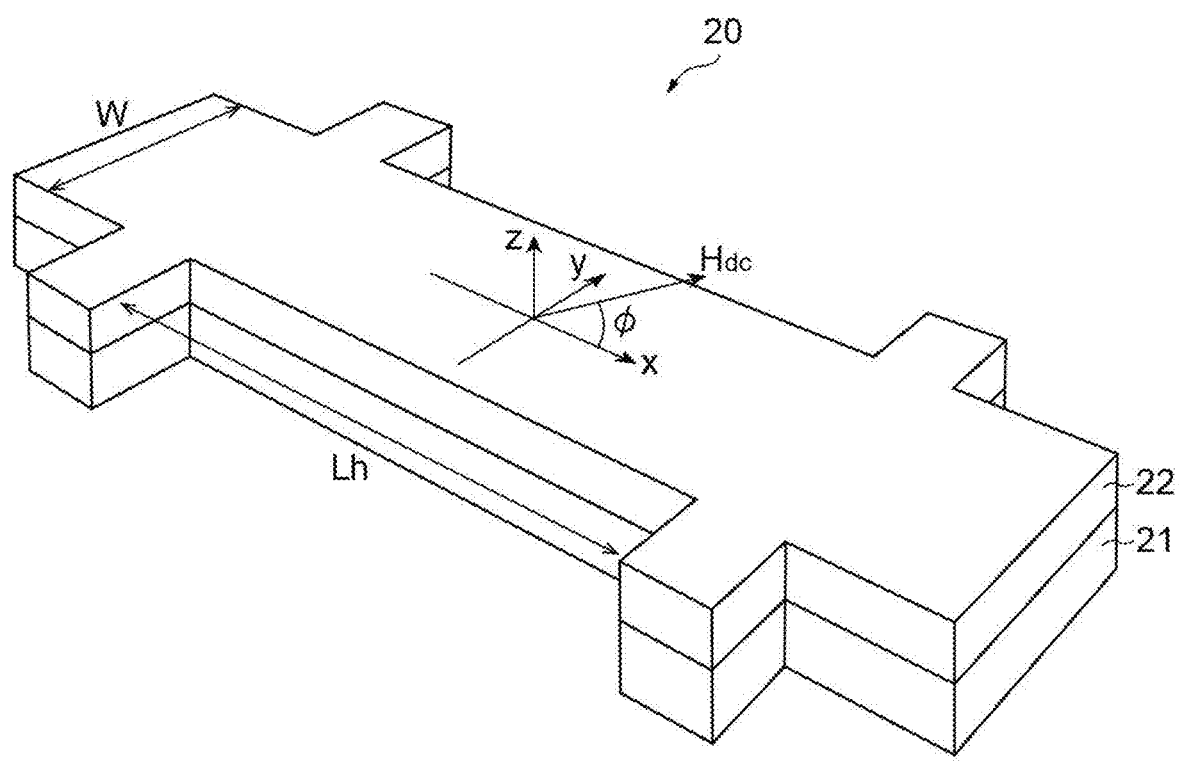

FIG. 7 is a perspective view showing an appearance of a Hall bar 20.

Figure 8:
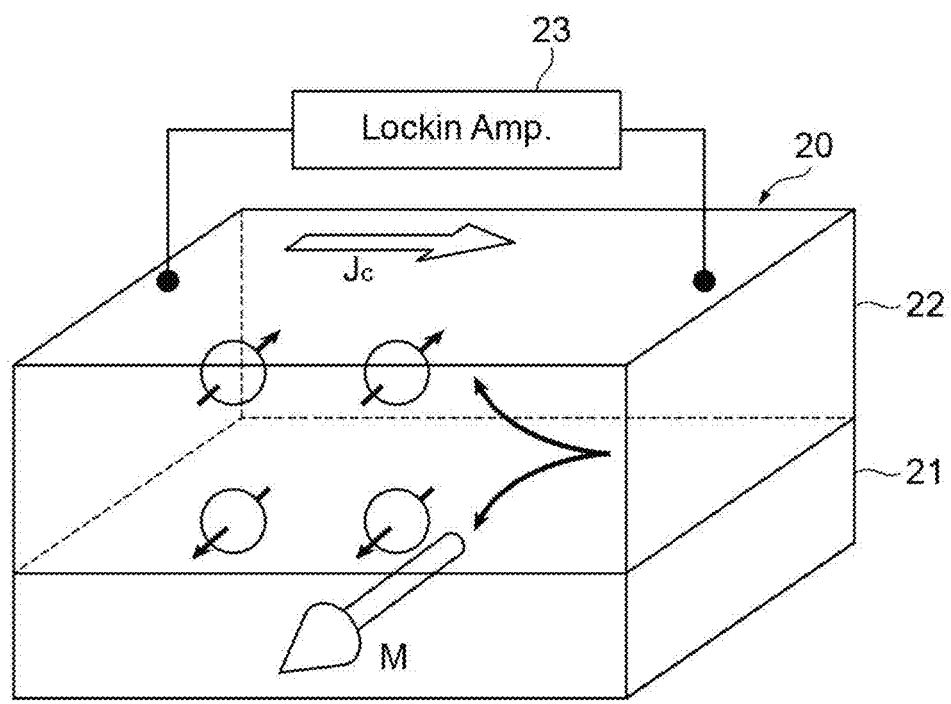

FIG. 8 is a diagram schematically showing an experimental setting for conversion of an electric current to a spin current.

FIG. 9 is a chart showing a result obtained by evaluating conversion efficiency $\theta_{J_cJ_s}$.

Figure 10:
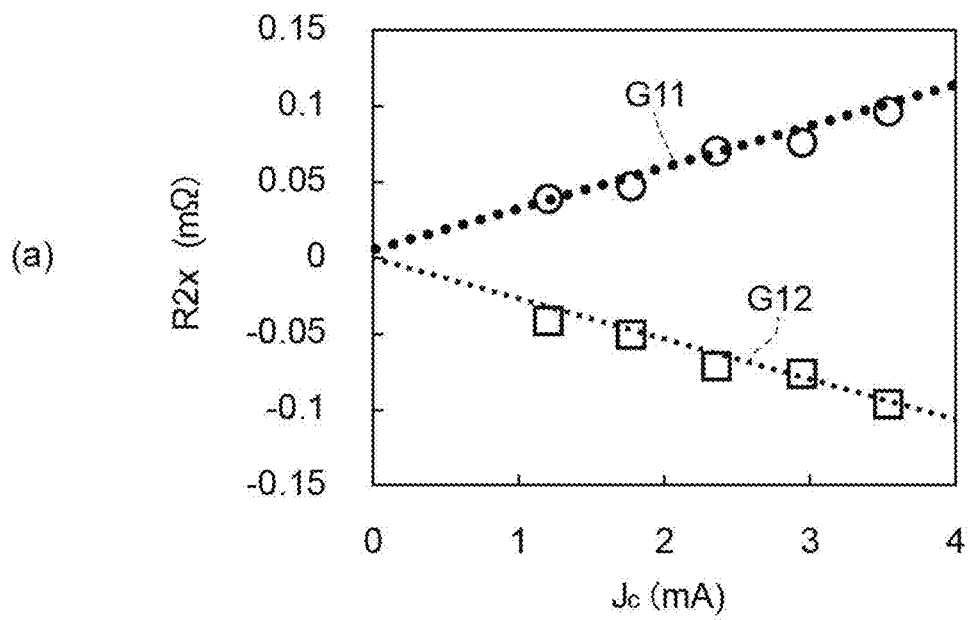
Figure 10:
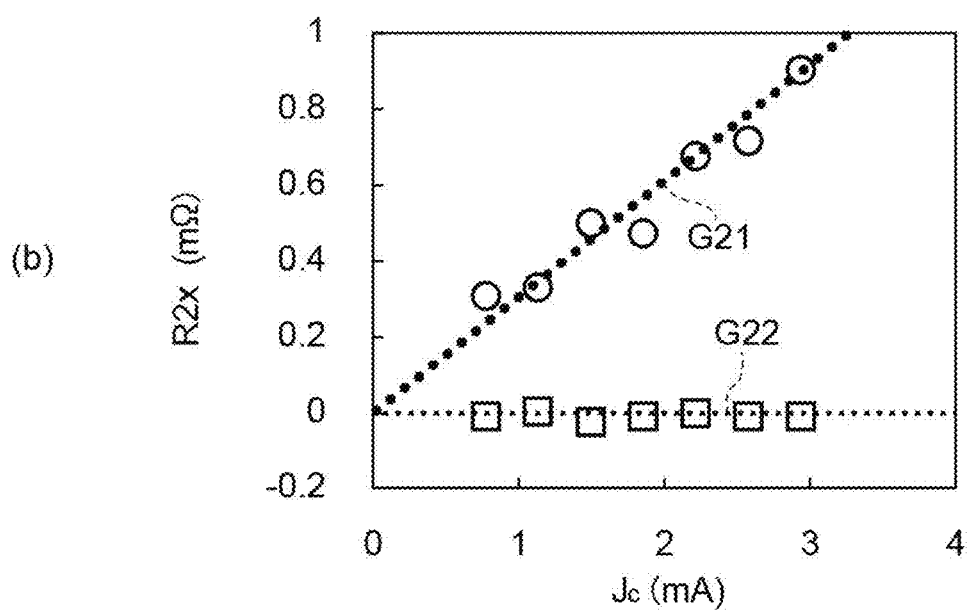

Part (a) of FIG. 10 is a graph showing electric current dependence of R2x in the samples S1 and S2. Part (b) of FIG. 10 is a graph showing electric current dependence of R2x in the samples S3 and S4.

Figure 11:
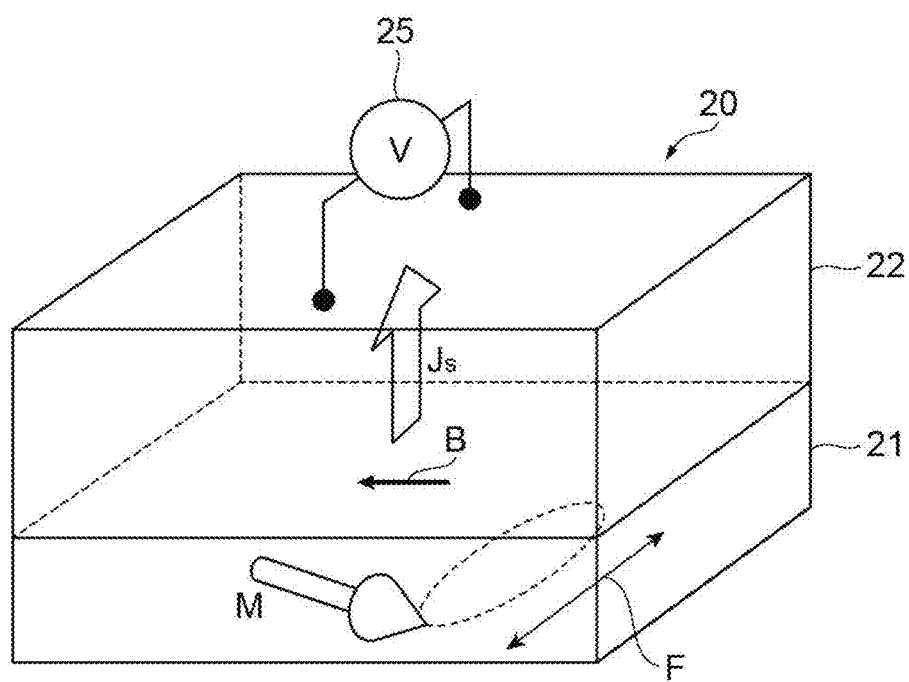

FIG. 11 is a diagram schematically showing a configuration for measuring conversion efficiency from a direct spin current to a direct electric current.

FIG. 12 is a chart showing a result obtained by evaluating conversion efficiency $\theta_{J_sJ_c}$.

Figure 13:
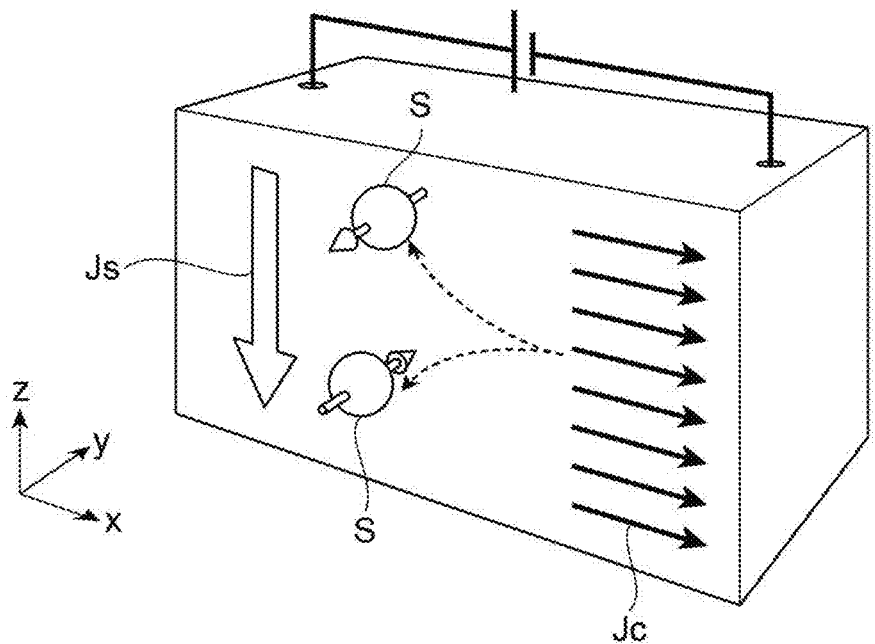
Figure 13:
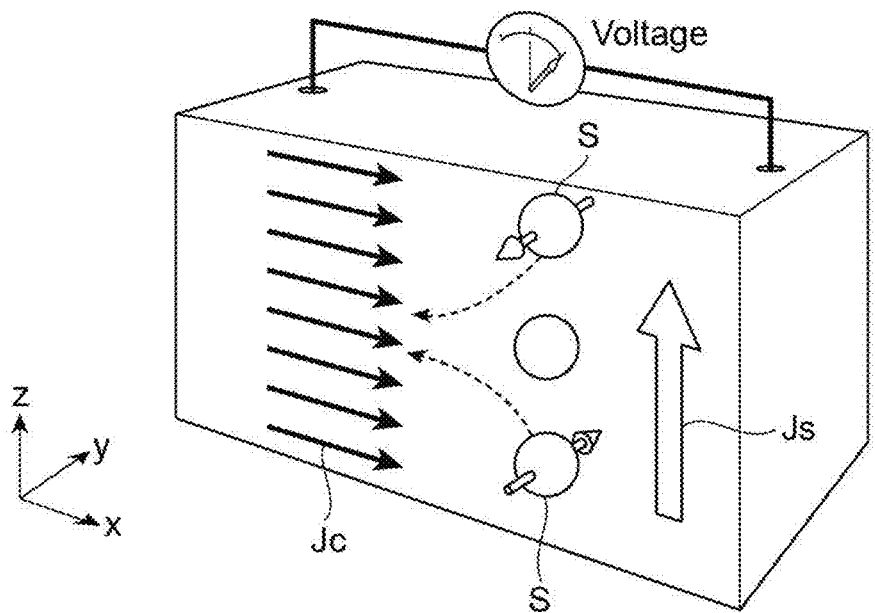

Part (a) of FIG. 13 is a diagram conceptually showing a scene of conversion of an electric current $J_c$ into a spin current $J_s$ in a Pt layer of the sample S1. Part (b) of FIG. 13 is a diagram conceptually showing a scene of conversion of the spin current $J_s$ into the electric current $J_c$ in the Pt layer of the sample S1.

Figure 14:
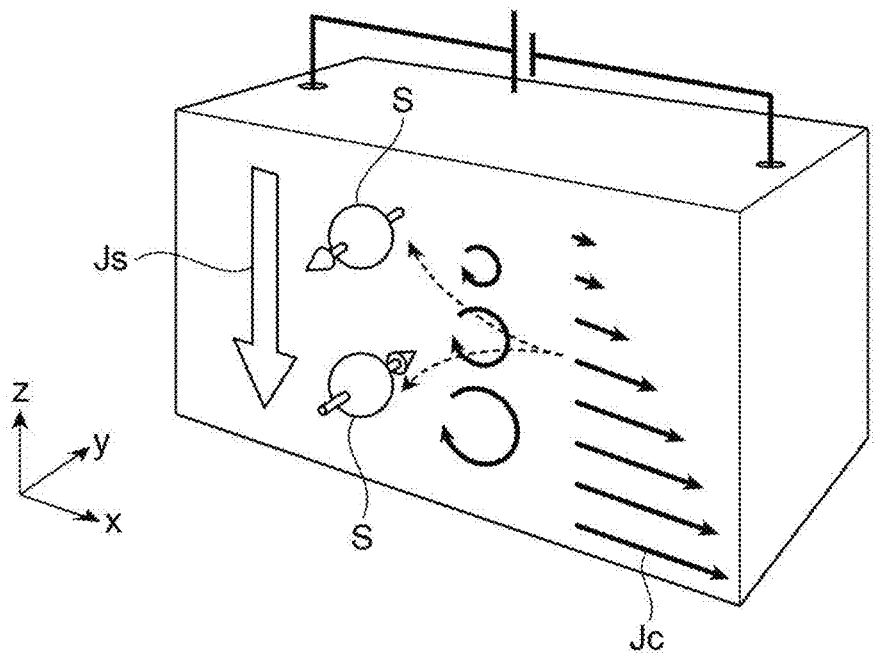
Figure 14:
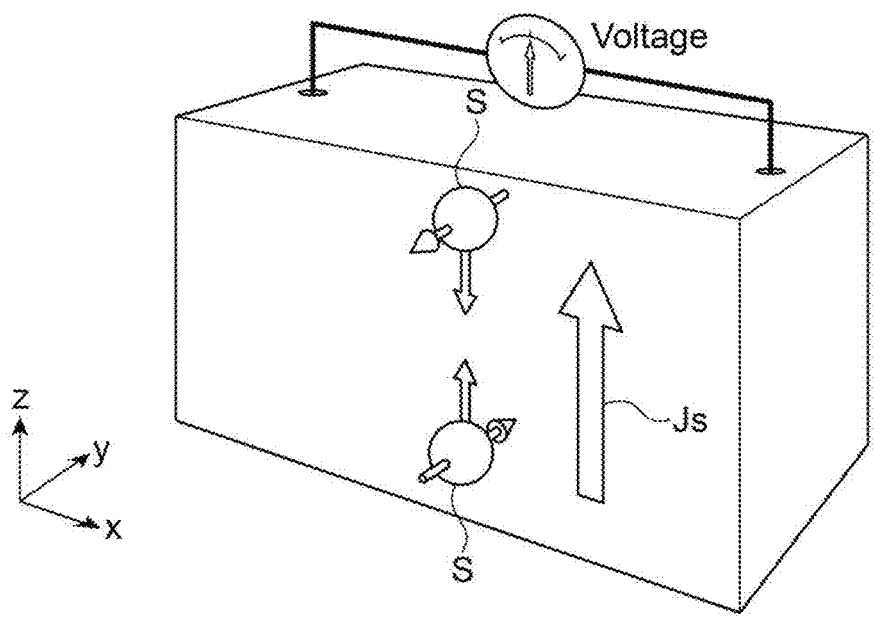

Part (a) of FIG. 14 is a diagram conceptually showing a scene of conversion of the electric current $J_c$ to the spin current $J_s$ in a Cu layer and a $Cu_2O$ layer of the sample S3 (particularly, a boundary region between these layers). Part (b) of FIG. 14 is a diagram conceptually showing a scene of conversion of the spin current $J_s$ to the electric current $J_c$ in the Cu layer and the $Cu_2O$ layer of the sample S3.

Figure 15:
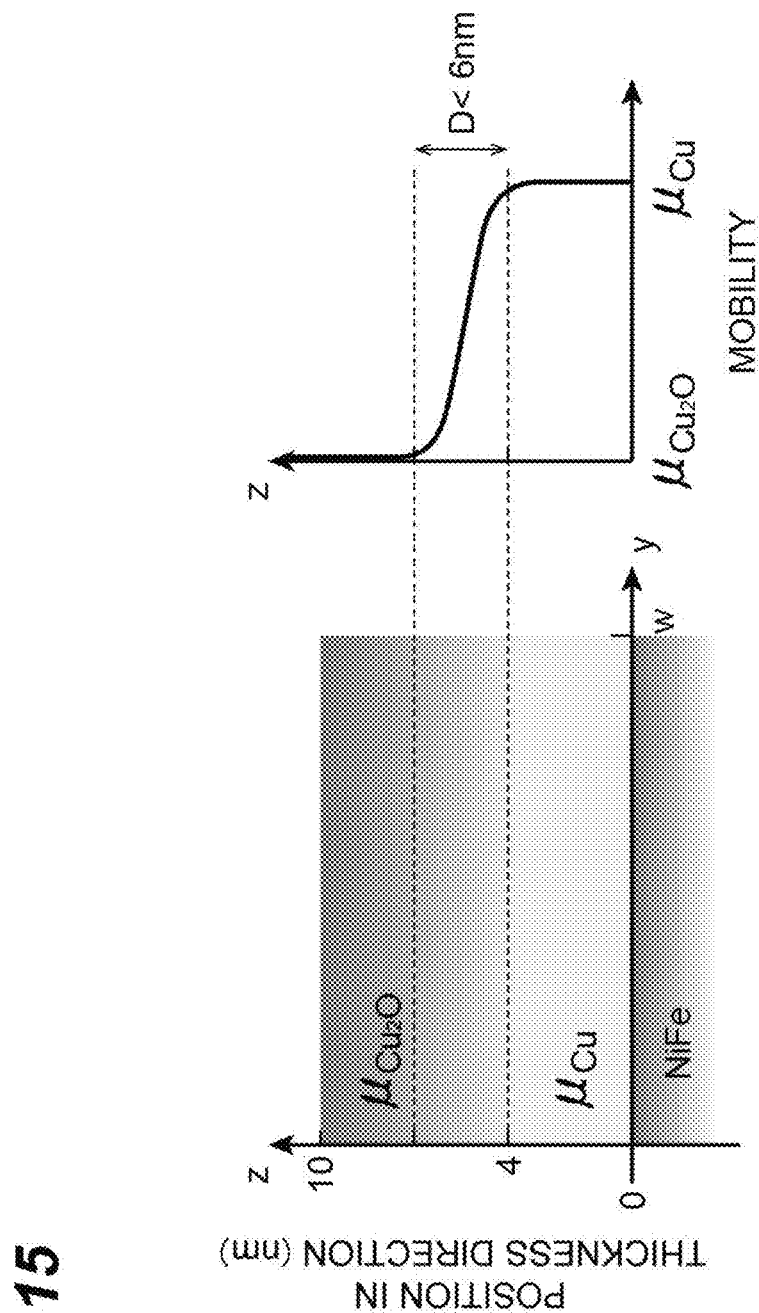

FIG. 15 is a diagram showing a schematic model of the layer structure of the sample S3.

Figure 16:
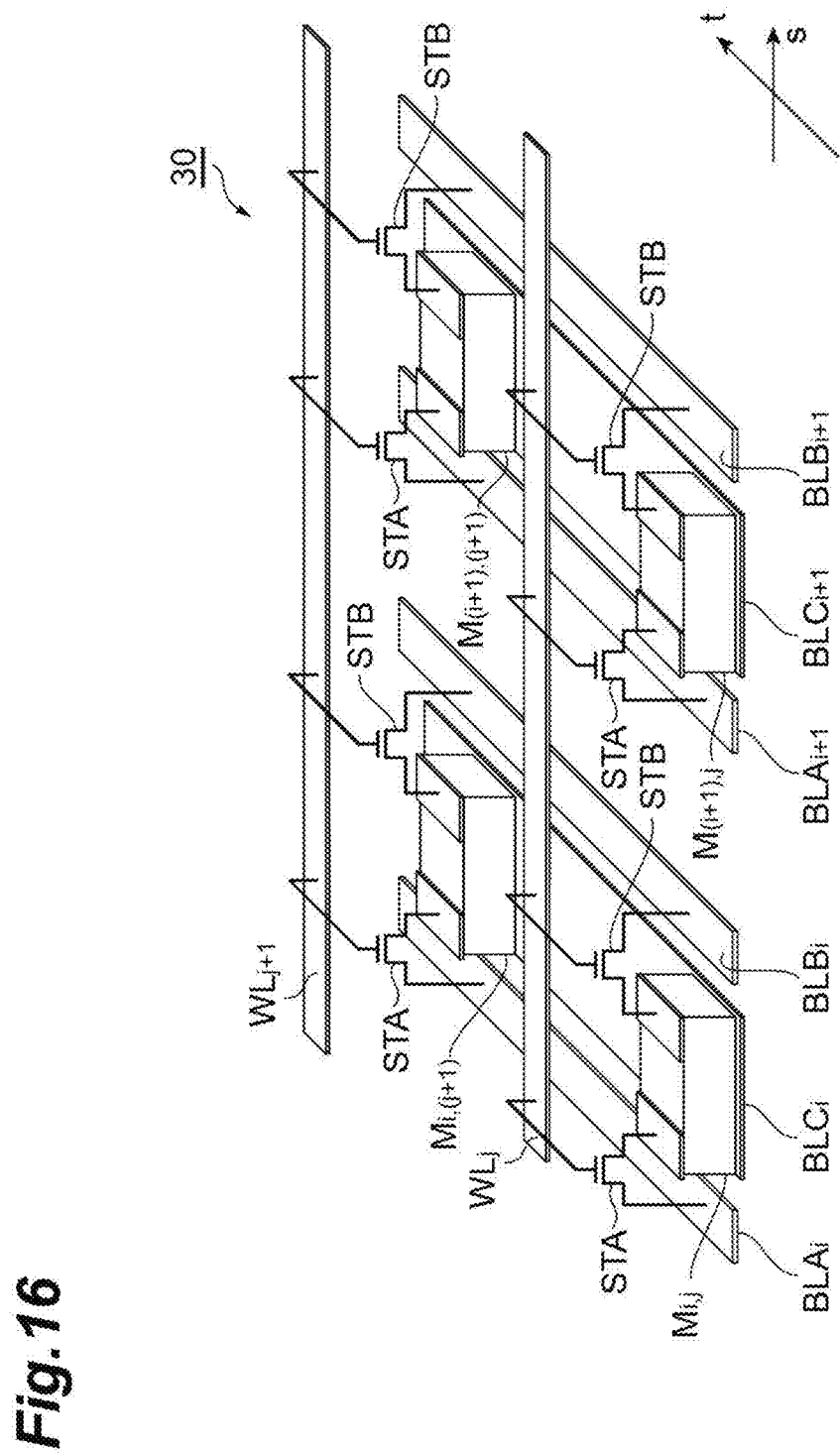

FIG. 16 is a perspective view showing a configuration of a magnetic memory 30 according to a second embodiment.

Figure 17:
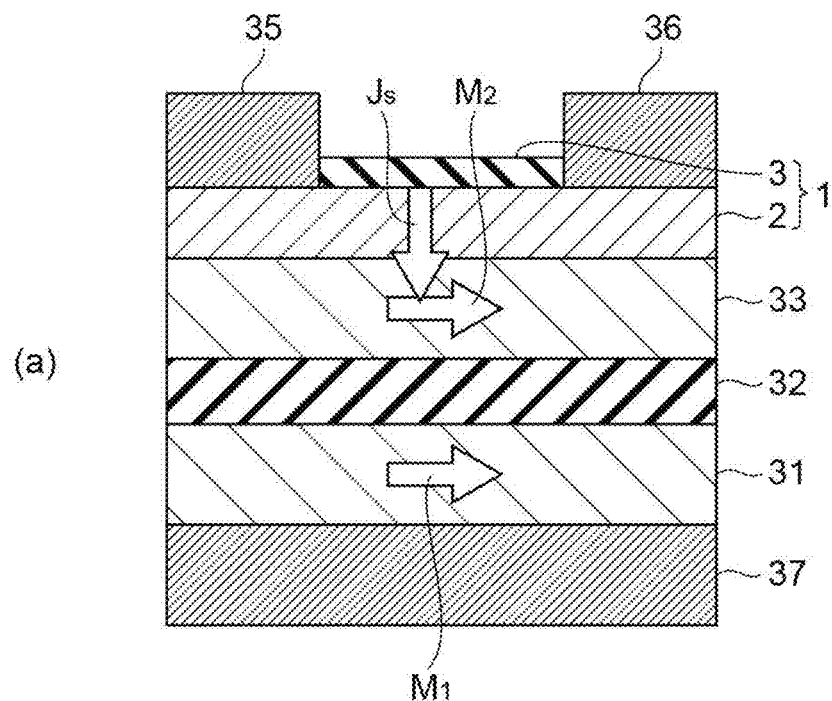
Figure 17:
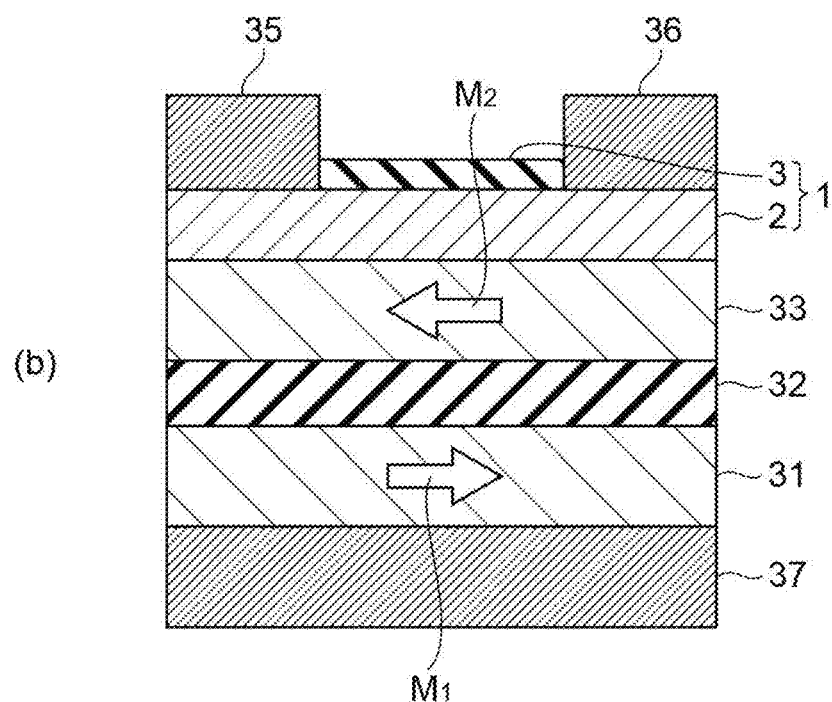

Part (a) and (b) of FIG. 17 are cross-sectional views showing a configuration of a storage element $M_{i,j}$.

Figure 18:
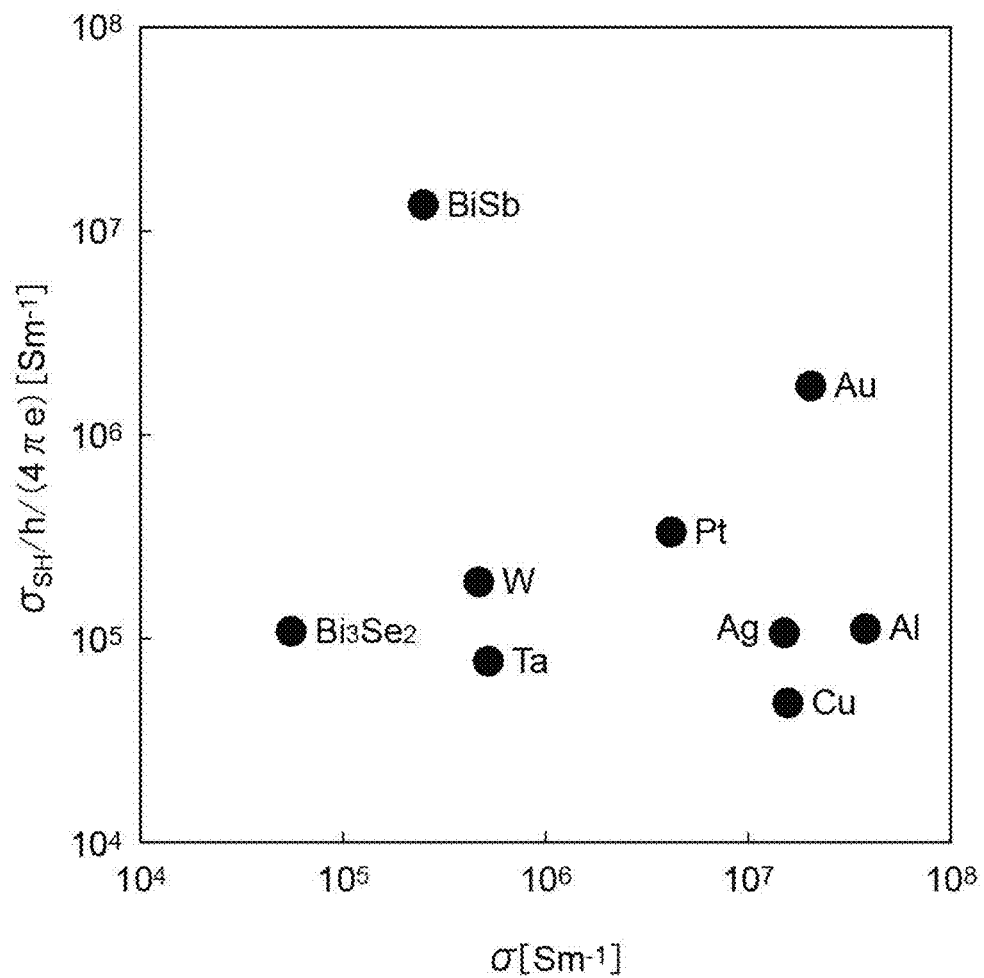

FIG. 18 is a graph showing a relationship between electrical conductance $\sigma$ of Au, Ag, Al, Cu, Pt, Ta, W, $Bi_3Se_2$, and BiSb and spin Hall conductance $\sigma_{SH}$.

Figure 19:
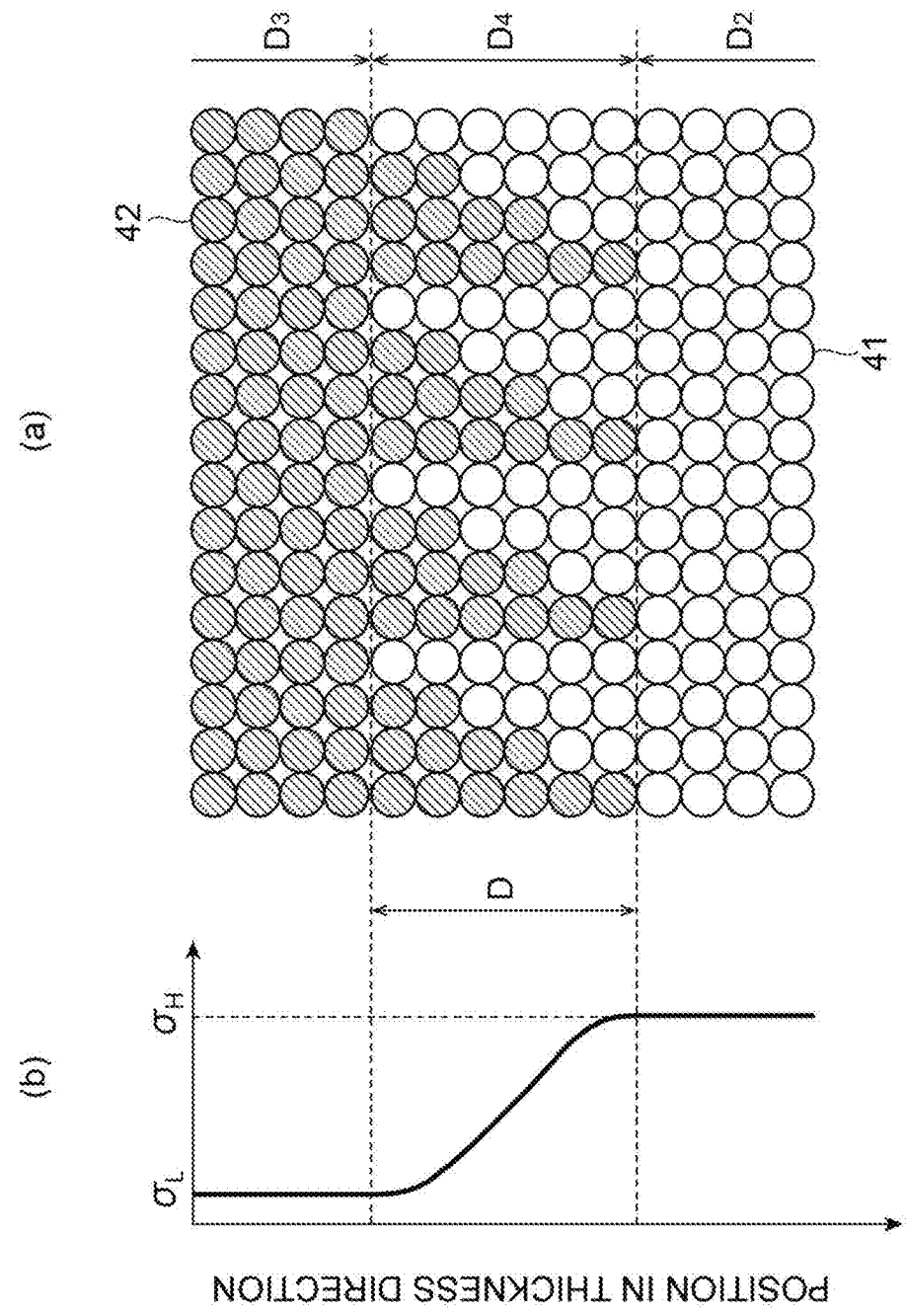

Part (a) of FIG. 19 is a diagram schematically showing an atomic structure near conductive layers 2 and 3 and a boundary region 4. Part (b) of FIG. 19 is a graph showing a change in electrical conductance $\sigma$ in a thickness direction.

Figure 20:
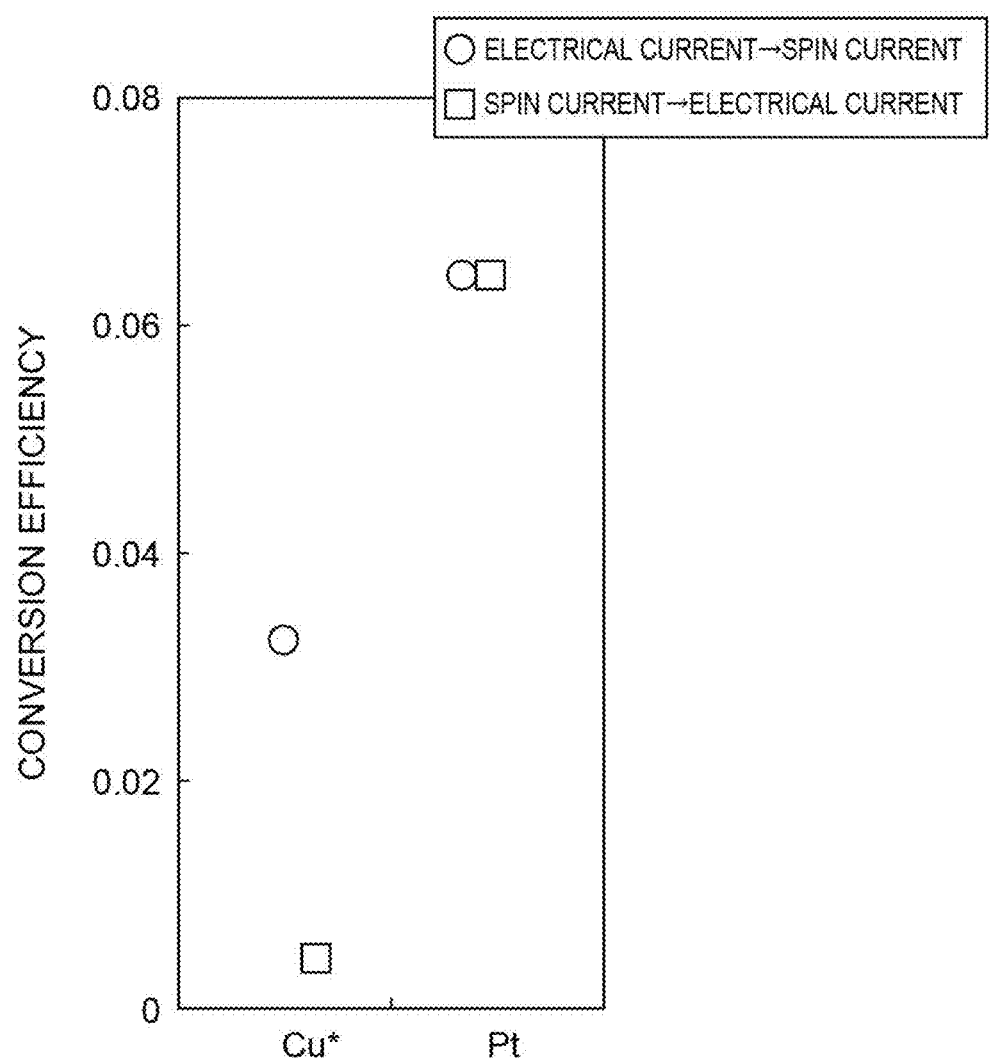

FIG. 20 is a graph showing conversion efficiency from an electric current to a spin current and conversion efficiency of the spin current to the electric current in Pt and a copper film (Cu*) having an oxide film formed on a surface.

Figure 21:
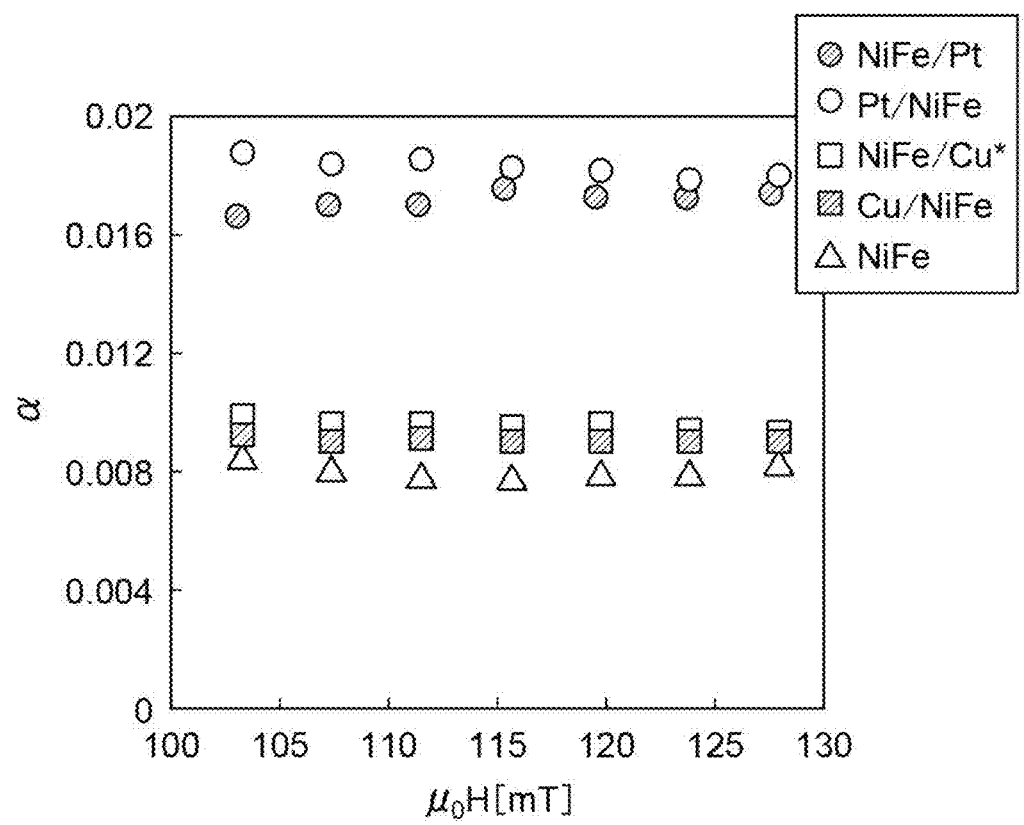

FIG. 21 is a graph showing a relationship between the Gilbert damping constant $\alpha$ representing a magnitude of friction and an external magnetic field $\mu_0H$.

Figure 22:
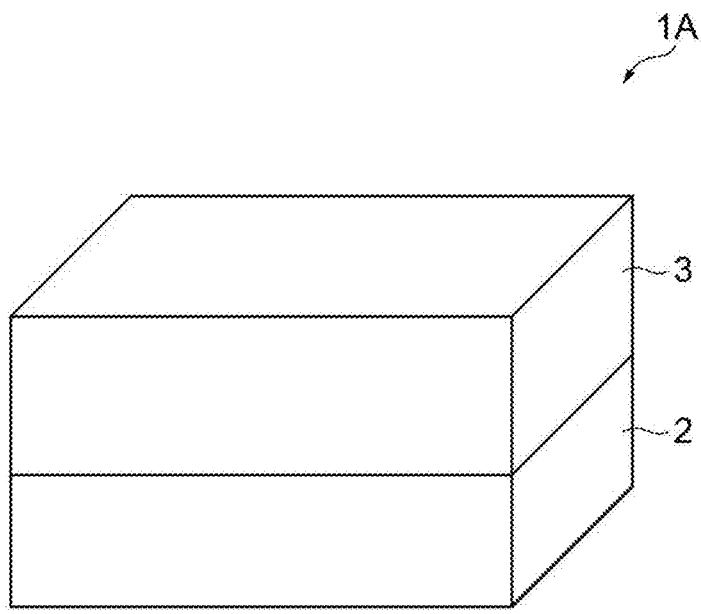

FIG. 22 is a perspective view showing a configuration of a spintronics device 1A according to a modification example.

Figure 23:
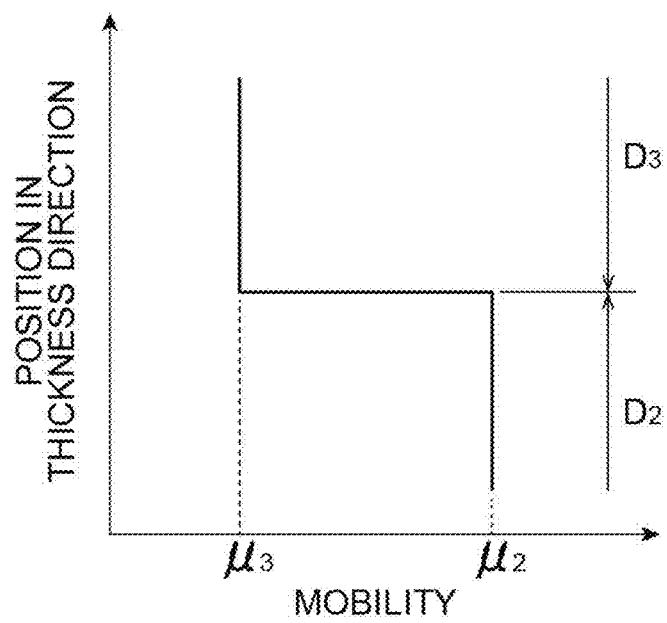

FIG. 23 is a graph showing a change in mobility of the device 1A in a stacking direction.

Figure 24:
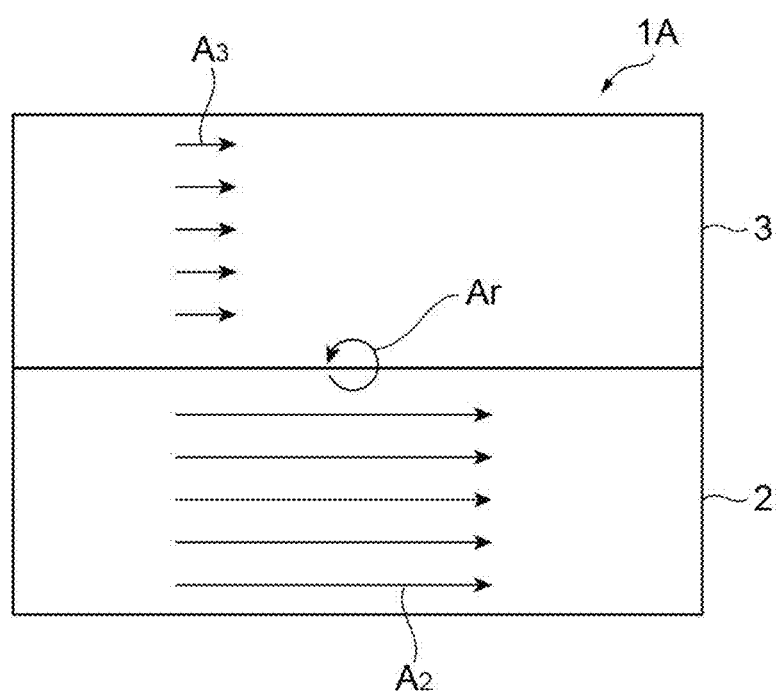

FIG. 24 is a schematic diagram showing velocities of electrons moving inside the device 1A when a voltage is applied in a direction intersecting the stacking direction.

Figure 25:
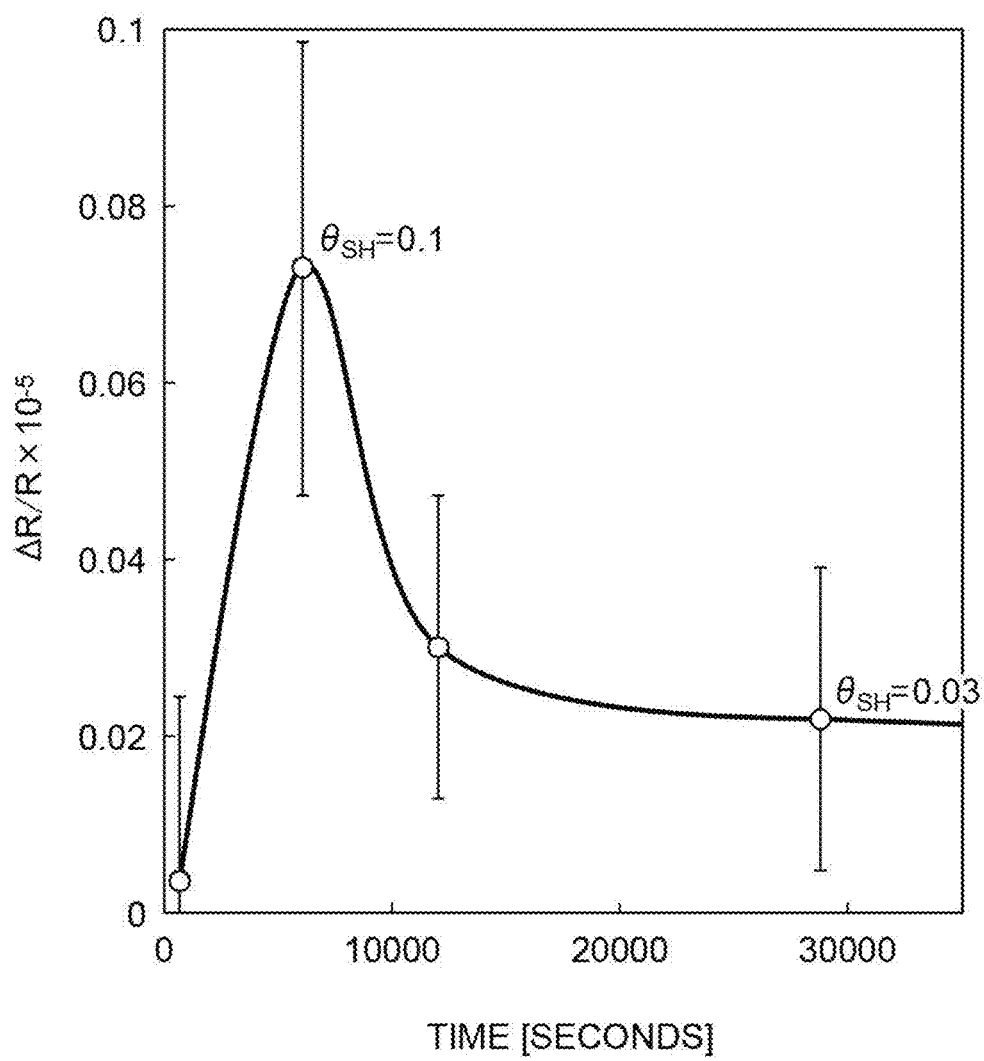

FIG. 25 is a graph showing a relationship between spin current intensity and an oxidation time in a copper thin film having an oxidized surface.

Figure 26:
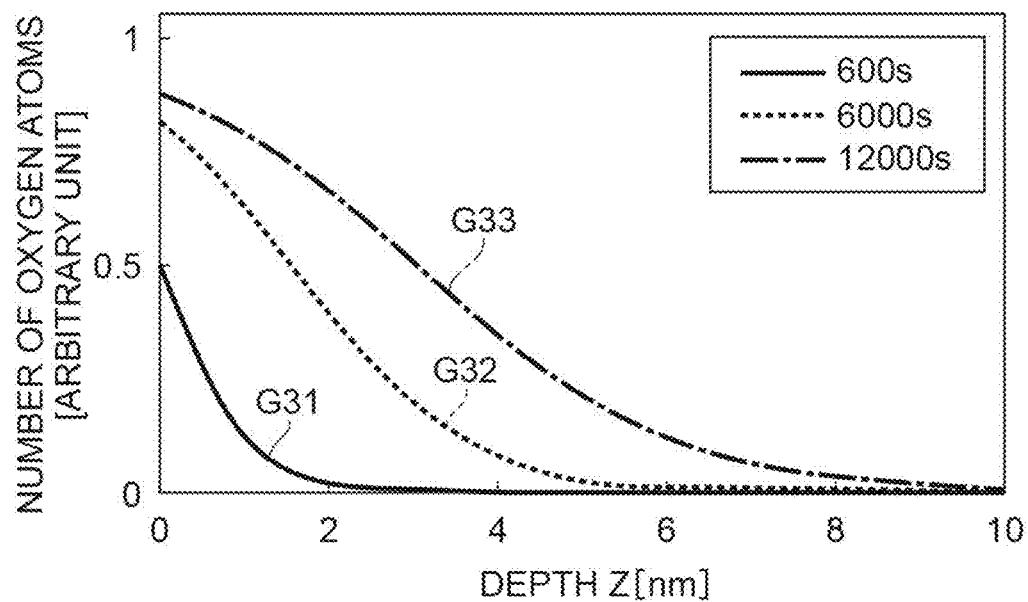
Figure 26:
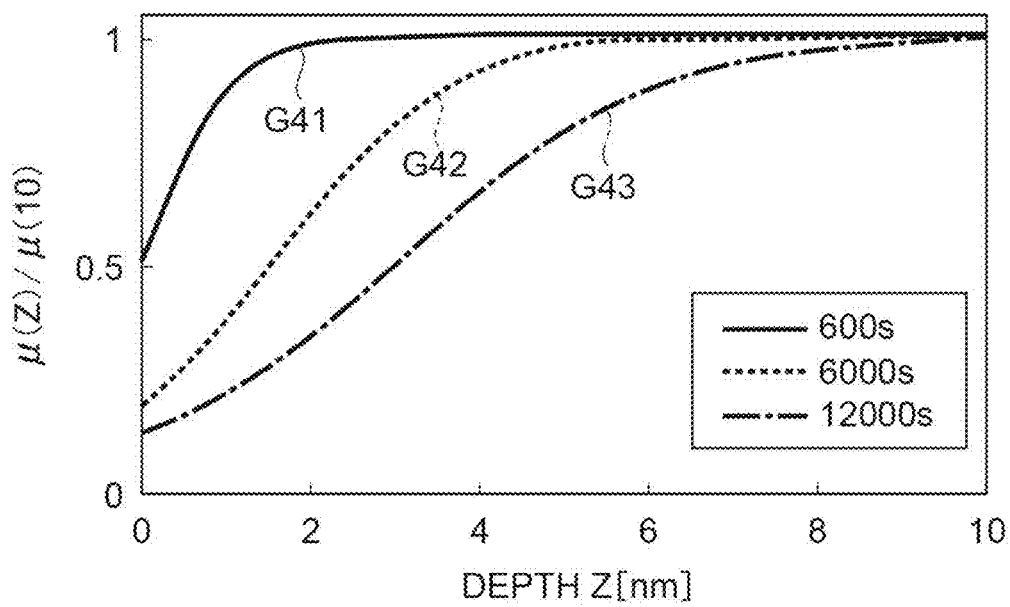

Part (a) of FIG. 26 is a graph showing a relationship between the distribution of oxygen atoms in a depth direction and an oxidation time. Part (b) of FIG. 26 is a graph showing a relationship between the distribution of electrical conductance in the depth direction and the oxidation time.

DESCRIPTION OF EMBODIMENTS

Hereinafter, embodiments of a spintronics device, a magnetic memory, and an electronics device according to the present disclosure will be described in detail with reference to the accompanying drawings. Further, in a description of the drawings, the same components are denoted by the same reference signs, and a redundant description will be omitted.

First Embodiment

Figure 1:
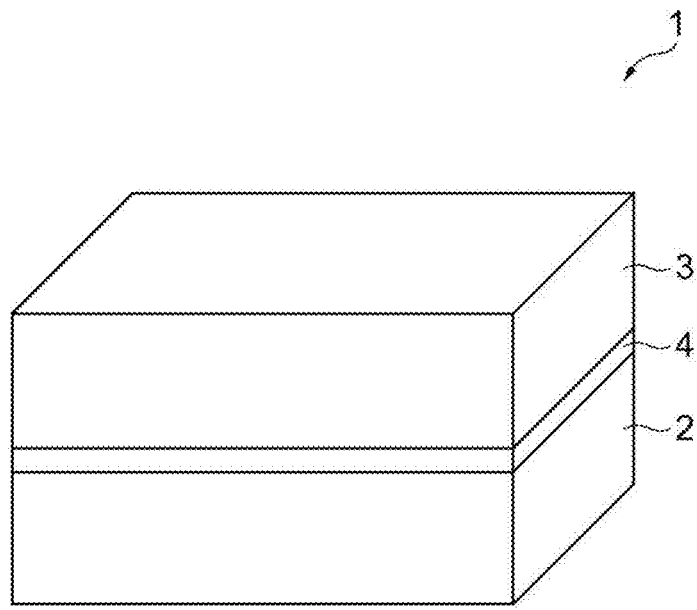
FIG. 1 is a perspective view showing a configuration of a spintronics device 1 according to a first embodiment.

FIG. 1 is a perspective view showing a configuration of a spintronics device 1 (hereinafter, simply referred to as a device 1) according to a first embodiment of the present disclosure. As shown in FIG. 1, the device 1 includes a conductive layer 2 (first conductive layer) and a conductive layer 3 (second conductive layer). A constituent material of the conductive layer 2 may be, for example, metal such as Cu, Al, Fe, Pt, Au, or Ag, a semiconductor such as Si or Ge, a compound semiconductor such as SiGe or AlGaAs, a conductive oxide such as $In_2O_3$, conductive nitride such as TiN, or a conductive polymer such as polyacetylene, or a combination thereof. A thickness of the conductive layer 2 is in a range of, for example, 0.1 to 1000 nm, and a thickness of the conductive layer 3 is in a range of, for example, 0.1 to 1000 nm.

The carrier mobility of a material constituting the conductive layer 3 (hereinafter, simply referred to as mobility) is lower than the mobility of the material constituting the conductive layer 2. The conductive layer 3 may be an oxide of a material constituting the conductive layer 2. That is, when the conductive layer 2 mainly contains copper (Cu), the conductive layer 3 may mainly contain copper oxide ($Cu_2O$, CuO, $Cu_2O_3$, $Cu_4O_3$, $Cu_3O$, or $Cu_4O$, or a mixture thereof). In one example, the conductive layer 2 is made of copper and the conductive layer 3 is made of copper oxide. Further, when the conductive layer 2 mainly contains aluminum (Al), the conductive layer 3 may mainly contain aluminum oxide ($Al_2O_3$). In one example, the conductive layer 2 is made of aluminum and the conductive layer 3 is made of aluminum oxide. The conductive layer 3 can be formed by oxidizing a surface of the conductive layer 2. The conductive layer 3 may be a natural oxide film formed on the surface of the conductive layer 2.

The device 1 further includes a boundary region 4. The boundary region 4 is a layered region present at a boundary between the conductive layer 2 and the conductive layer 3. When the boundary region 4 is observed macroscopically, the conductive layer 2 and the conductive layer 3 are in contact with each other, but when the boundary region 4 is observed microscopically, the boundary region 4 having a slight thickness is formed between the conductive layer 2 and the conductive layer 3 due to the diffusion of atoms. A thickness of the boundary region 4 is, for example, greater than 0 nm and less than or equal to 100 nm. The thickness of the boundary region 4 may be a value very close to 0, for example, a few angstroms. The constituent material of the conductive layer 2 and the constituent material of the conductive layer 3 are mixed in the boundary region 4. In the boundary region 4, a proportion of the constituent material of the conductive layer 2 becomes larger in the boundary region closer to an interface with the conductive layer 2, and a proportion of the constituent material of the conductive layer 3 becomes larger in the boundary region closer to an interface with the conductive layer 3.

Figure 2:
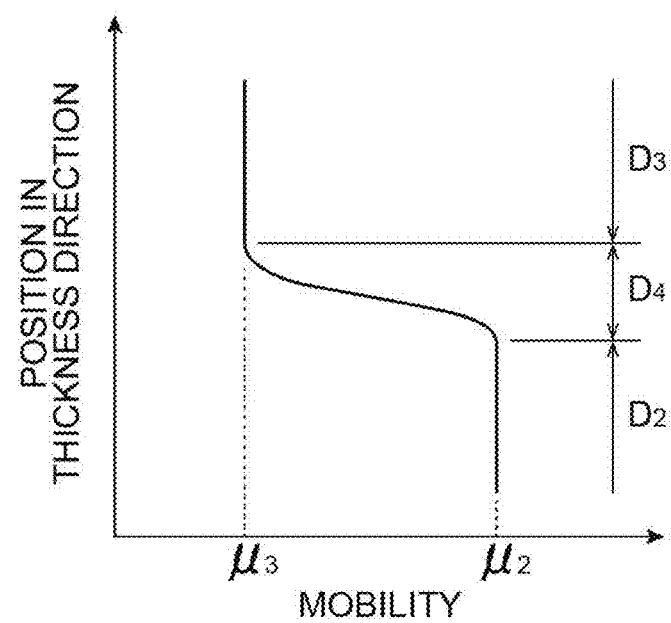
FIG. 2 is a graph showing a change in carrier mobility of the device 1 in a stacking direction.

FIG. 2 is a graph showing a change in the mobility of the device 1 in a stacking direction. In FIG. 2, a range $D_2$ corresponds to the conductive layer 2, a range $D_3$ corresponds to the conductive layer 3, and a range $D_4$ corresponds to the boundary region 4.

As shown in FIG. 2, a mobility $\mu_3$ of the material constituting the conductive layer 3 is lower than a mobility $\mu_2$ of the material constituting the conductive layer 2. The mobility $\mu_2$ of the conductive layer 2 is, for example, greater than 0 and 50,000 cm²/Vs or less, and the mobility $\mu_3$ of the conductive layer 3 is, for example, greater than 0 and 50,000 cm²/Vs or less. A lower limit of a ratio ($\mu_2/\mu_3$) of the mobilities is, for example, 10. An upper limit of the ratio ($\mu_2/\mu_3$) is, for example, 100000, but may be larger than such a value from the viewpoint of spin current generation. The carrier mobility of the boundary region 4 has a gradient, and changes continuously from the interface with the conductive layer 2 to the interface with the conductive layer 3. A rate of change in the mobility in the boundary region 4 may or may not be constant in a thickness direction. For example, a rate of change in the mobility in regions located in the middle of the conductive layers 2 and 3 may be larger than that in regions close to the conductive layers 2 and 3. The change in the mobility is caused by a change in a proportion of the material constituting the boundary region 4.

Part (a) and part (b) of FIG. 3 are schematic diagrams showing velocities of electrons moving inside the device 1 when a voltage is applied in a direction intersecting the stacking direction. Part (a) of FIG. 3 shows the entire device 1, and part (b) of FIG. 3 is an enlarged view near the boundary region 4. Arrows $A_2$ in the figure indicate the movement of electrons in the conductive layer 2, arrows $A_3$ indicate the movement of electrons in the conductive layer 3, and arrows $A_4$ indicate the movement of electrons in the boundary region 4. Lengths of the arrows $A_2$ to $A_4$ represent moving velocities of the electrons, and as the arrow becomes longer, the moving velocity of the electron becomes higher. When a voltage is applied to a material containing free electrons, the electron repeatedly accelerates and decelerates while colliding with a scatterer in the material, and travels in a voltage application direction in the material while moving in a zigzag motion. When the movement of the electron is observed on a large scale in time and space, it can be understood that an electron group moves uniformly in one direction. Arrows $A_2$ to $A_4$ in FIG. 3 represent the uniform movement of such electron groups.

The moving velocities of the electrons moving in the conductive layer 2 having high mobility are faster than the moving velocities of the electrons moving in the conductive layer 3 having low mobility. Accordingly, arrow $A_2$ is longer than arrow $A_3$. On the other hand, unlike the conductive layers 2 and 3 having uniform mobilities, a non-uniform distribution occurs in the moving velocities of the electrons in the boundary region 4. In the present embodiment, the mobility in the boundary region 4 has a gradient, and the mobility changes continuously so as to be high near the interface with the conductive layer 2 and low near the interface with the conductive layer 3. Accordingly, as shown in part (b) of FIG. 3, the moving velocities of the electrons in the boundary region 4 change continuously so as to be high near the interface with the conductive layer 2 and low near the interface with the conductive layer 3. The rate of change of the moving velocities of the electrons in the boundary region 4 may or may not be constant in the thickness direction. For example, the rate of change of the moving velocities in the regions located in the middle of the conductive layers 2 and 3 may be larger than that in the regions close to the conductive layers 2 and 3. Such a change in moving velocities is also caused by a change in the proportion of the material constituting the boundary region 4.

A spin current generation action in the device 1 will be described. FIG. 4 is a schematic diagram showing a generation mechanism of a spin current due to Rayleigh waves as a reference example. The Rayleigh wave is a type of sound wave, and is a phenomenon in which elastic deformation of a solid propagates on a surface as a wave. When a pair of comb-type electrodes are arranged so as to face each other on a surface of a piezoelectric substance and a high-frequency voltage is applied between these comb-type electrodes, the Rayleigh wave is generated on the surface of the piezoelectric substance. When a metal coating 102 is formed in a traveling direction of the Rayleigh wave, the Rayleigh wave propagates on a surface 102a of the metal coating 102. At this time, in a cross section near the surface 102a of the metal coating 102, lattice points Q in the metal coating 102 move in a rotational motion in an elliptical shape. Two circles C1 and C2 in the figure represent trajectories of two typical lattice points Q1 and Q2, respectively. This means that each lattice point Q in the metal coating 102 has angular momentum. A rotation frequency thereof reaches several GHz. The above-mentioned angular momentum is converted into an electron spin (upspin or downspin) in one direction by the so-called Barnett effect in which a mechanical rotational motion is converted into an electron spin by the law of conservation of angular momentum. Normally, in a paramagnetic substance, the numbers of upspins and downspins in which directions of spins are directions opposite to each other are equal to each other when viewed locally. However, when the number of electron spins in one of the numbers of upspins and downspins increases, this equilibrium state is disturbed, and the shading in the upspins and downspins occur. That is, there is a region where one of the numbers of upspins and downspins is larger than the other. At this time, in order to maintain the equilibrium state between the upspins and the downspins, the spin moves in a direction in which the shading is eliminated. This is the spin current. However, since electric charges do not move, an electric current does not flow.

The generation of the spin current in the present embodiment can be described in the same manner as this mechanism. Focusing on a minute region of the boundary region 4, it can be considered that a velocity field (vector field) of the electron is rotating due to a difference between the moving velocities of the electrons (arrow Ar in part (b) of FIG. 3). A magnitude of the rotation Ar of this velocity field can also be regarded as vorticity. Due to the rotation Ar of this velocity field, the angular momentum is present in a flow of a plurality of electrons in the boundary region 4. This angular momentum is converted into an electron spin (upspin or downspin) in one direction. Accordingly, the equilibrium state between the upspins and the downspins is disturbed, and a relative distribution of the upspins and the downspins is biased. As a result, the spin current is generated in a direction in which the bias of the distribution is eliminated (that is, a direction from the boundary region 4 toward the conductive layer 2).

As shown in examples to be described later, a spin current having a magnitude substantially equal to or larger than the spin current based on the spin orbit interaction (SOI) can be generated by the above action. The generation of the spin current based on the SOI of the related art requires a special material such as precious metal (for example, Pt) that causes SOI, but the above action is exhibited by merely forming the gradient of the mobility, and the special material such as Pt is not required. Accordingly, it is possible to use non-magnetic metal such as Cu or Al which has only slight SOI, and it is possible to further use a semiconductor such as Si. That is, in accordance with the device 1 of the present embodiment, the spin current can be generated without depending on the specific material.

As in the present embodiment, the device 1 may include the conductive layer 2 and the conductive layer 3 having mobility lower than that of the conductive layer 2. In the boundary region 4 located between the conductive layer 2 and the conductive layer 3 having different mobilities, the gradient of the mobility is spontaneously formed due to the diffusion of atoms or the like as shown in FIG. 2. Thus, the device 1 includes the conductive layers 2 and 3, and thus, it is possible to easily realize the region having the gradient of the mobility.

The device 1 may not include a ferromagnetic layer adjacent to the conductive layer 2. In accordance with the device 1, the spin current can be generated without including the ferromagnetic layer by the above-mentioned action.

As in the present embodiment, the conductive layer 3 may contain the oxide of the material constituting the conductive layer 2. Accordingly, the conductive layer 3 having mobility lower than that of the conductive layer 2 can be easily formed. However, the present embodiment does not prevent the conductive layer 3 from being made of another material (different kind of material) except for the oxide of the material constituting the conductive layer 2. Even in such a case, when the boundary region 4 can be formed between the conductive layer 2 and the conductive layer 3, the generation action of the spin current described above can be obtained.

The mobility has a positive correlation with electrical conductivity. That is,
the mobility is expressed as follows.

(mobility)=(electrical conductivity)/(product of electric charge and carrier density)

Accordingly, in the description of this specification, the mobility can be replaced with electrical conductivity.

Example 1

An experiment conducted by the present inventor to verify the above theory will be described. The following experiments were all performed in a room temperature environment. FIGS. 5 and 6 are diagrams showing layer structured of samples prepared for the experiment. A sample S1 shown in part (a) of FIG. 5 has a stacking structure of a NiFe layer as the ferromagnetic layer and a Pt layer which is precious metal that causes the SOI provided on the NiFe layer. A sample S2 shown in part (b) of FIG. 5 has a stacking structure of a Pt layer and a NiFe layer provided on the Pt layer. A sample S3 shown in part (a) of FIG. 6 has a stacking structure of a NiFe layer, a Cu layer that causes slight SOI provided on the NiFe layer, and a $Cu_2O$ layer which is an oxide film formed on a surface of the Cu layer. A sample S4 shown in part (b) of FIG. 6 has a stacking structure of a Cu layer and a NiFe layer provided on the Cu layer. A thickness of the NiFe layer was 5 nm, and a thickness of the Pt layer was 10 nm. A combined thickness of the Cu layer and the $Cu_2O$ layer was set to 10 nm in part (a) of FIG. 6, and a thickness of the Cu layer was set to 10 nm in part (b) of FIG. 6. The $Cu_2O$ layer was formed by exposing the surface of the Cu layer to the atmosphere at room temperature for 40 hours.

First, in order to investigate mutual conversion between the electric current and the spin current, Hall bars were prepared by using the samples S1 to S4, respectively. FIG. 7 is a perspective view showing an appearance of a Hall bar 20. A first layer 21 is the NiFe layer in the samples S1 and S3, is the Pt layer in the sample S2, and the Cu layer in the sample S4. A second layer 22 is the Pt layer in the sample S1, is the Cu layer and the $Cu_2O$ layer in the sample S3, and is the NiFe layer in the samples S2 and S4. The Hall bar 20 has a length Lh of 20 μm and a width W of 8 μm. In order to facilitate understanding, FIG. 7 also shows an xyz Cartesian coordinate system. An x-axis is along a longitudinal direction of the Hall bar 20, an y-axis is along a lateral direction of the Hall bar 20, and a z-axis is along a stacking direction of the Hall bar 20. In this experiment, an external magnetic field $H_{dc}$ was applied to the Hall bar 20. The external magnetic field $H_{dc}$ is along an xy plane, and an angle between the external magnetic field $H_{dc}$ and the x-axis is φ. An insulating film having a thickness of 70 nm made of $SiO_2$ was formed on a surface of each Hall bar 20, and a coplanar transmission line made of a Ti layer having a thickness of 5 nm and an Au layer having a thickness of 100 nm was formed on the insulating film.

<Conversion from Current to Spin Current>

The inventor conducted an experiment on the conversion of the electric current into the spin current by using this Hall bar 20. FIG. 8 is a diagram schematically showing a configuration thereof. FIG. 8 shows the case of the samples S1 and S3, but the same applies to the samples S2 and S4. A lock-in amplifier 23 was connected to the Hall bar 20, and a second harmonic component R2x of an electrical resistance in the longitudinal direction (x direction) was measured while applying an alternating current $J_c$ in the Hall bar 20. A frequency of the electric current $J_c$ was set to 137 Hz. The external magnetic field $H_{dc}$ was applied in a y direction, and a magnitude of a magnetic flux density $\mu_0 H_y$ was set to −300 to 300 mT. A magnitude of R2x contains a resistance component increased by spin accumulation generated at an interface between the first layer 21 and the second layer 22. A conversion efficiency $\theta_{J_c J_s}$ from the electric current to the spin current in each of the samples S1 to S4 was evaluated based on R2x.

FIG. 9 is a chart showing a result obtained by evaluating $\theta_{J_c J_s}$ in each of the samples S1 to S4. Sam. 1 to Sam. 4 correspond to the samples S1 to S4, respectively. Cu* represents Cu in which the oxide layer is present. A numerical value in parentheses represents a thickness (unit: nm). The inventor measured a value of Undirectional Spin-Hall Magnetroresistance (USMR) in order to evaluate the conversion efficiency $\theta_{J_c J_s}$. The USMR is a magnetic resistance generated by spin accumulation at the interface between the first layer 21 and the second layer 22, and is proportional to the spin current generated by the second layer 22. Accordingly, the conversion efficiency from the electric current to the spin current can be evaluated from a slope of the USMR as a function of the electric current.

The electric current dependence of R2x was investigated in order to decide the magnitude of the conversion efficiency $\theta_{J_cJ_s}$ in each of the samples S1 to S4 from a value of R2x. Graphs G11 and G12 shown in part (a) of FIG. 10 show the electric current dependence of R2x in the samples S1 and S2, respectively. Graphs G21 and G22 shown in part (b) of FIG. 10 show the electric current dependence of R2x in the samples S3 and S4, respectively. Slopes of the graphs in parts (a) and (b) of FIG. 10 represent the conversion efficiency $\theta_{J_cJ_s}$.

As shown in part (a) of FIG. 10, when a stacking order of the Pt layer and the NiFe layer is reversed, the sign of R2x is reversed in the samples S1 and S2, but the magnitude of R2x is proportional to the electric current regardless of the stacking order. This result suggests the fact that when the stacking order of the Pt layer and the NiFe layer is reversed, spin polarization of the spin current injected into the NiFe layer is switched. Spin accumulation at the interface is linearly dependent on the electric current. This is because the magnitude of the spin current generated by the spin Hall effect (SHE) of Pt is proportional to the electric current. As a result, R2x increases linearly with respect to the electric current.

As shown in part (b) of FIG. 10, the value of R2x in the sample S3 increases linearly with respect to the electric current, while the value of R2x in the sample S4 is very small regardless of the electric current. This result clearly suggests that the stacking structure of the Cu layer and the oxide layer thereof can generate the spin current and the configuration of only the Cu layer in which the oxide layer is not present cannot generate the spin current. When the conversion efficiency $\theta_{J_cJ_s}$ was calculated from R2x, the conversion efficiency was 0.064 for Pt and was 0.039 for Cu in which the oxide layer is present. It should be noted that the conversion efficiency $\theta_{J_cJ_s}$ is on the same order of magnitude between Pt and Cu in which the oxide layer is present. A relative magnitude of the conversion efficiency of the copper oxide is almost equal to that described in Non-Patent Document 6, but a spin torque FMR (ST-FMR) at a frequency of several GHz is measured in order to generate an alternating spin current instead of direct electric current in Non-Patent Document 6.

<Conversion from Spin Current to Current>

The conversion of a direct spin current to a direct electric current caused by spin injection can be evaluated by using the inverse spin Hall effect (inverse SHE) in the sample. The spin accumulates at the interface between the ferromagnetic layer and a non-magnetic layer due to the excitation of ferromagnetic resonance (FMR) in the ferromagnetic layer. Thereafter, the spin current is injected into the non-magnetic layer. The spin current is converted into the direct electric current by the inverse SHE of the non-magnetic layer. In this experiment, the direct spin current with the spin polarization along the x direction was converted into the electric current, and a Hall voltage $V_y$ was generated along the y direction.

A polarity of the Hall voltage $V_y$ due to the inverse SHE is expected to be the same in the sample S1 and the sample S3. This is because a sign of the conversion efficiency from the electric current to the spin current measured by using the USMR is positive for both the samples S1 and S3 as shown in FIG. 9. The USMR and the inverse SHE were measured by using the same sample in order to exclude a variation between the samples.

FIG. 11 is a diagram schematically showing a measurement system thereof. A microwave having a power of 20 dBm was applied to the coplanar transmission line prepared on the Hall bar 20, and thus, an alternating magnetic field was generated in a direction of a left right arrow F of the NiFe layer (first layer 21). A frequency of the microwave matched a frequency of the ferromagnetic resonance of NiFe, and thus, ferromagnetic resonance was generated in the NiFe layer. The frequency of the microwave is 4 to 12 GHz. At this time, a direction of the external magnetic field $H_{dc}$ was set to be parallel to the x-axis. In this case, a direct spin current $J_s$ with the spin polarization along an −x direction (arrow B) from the NiFe layer (first layer 21) to the other layer (second layer 22) is generated due to the spin pumping (SP) effect. At this time, the spin current $J_s$ is converted into the electric current $J_c$ by the SOI of the other layer, and the electric current $J_c$ generates the Hall voltage in the lateral direction (y-axis direction). This Hall voltage $V_y$ was measured by using a voltmeter 25. Conversion efficiency $\theta_{J_sJ_c}$ from the spin current to the electric current in each of the samples S1 to S4 was evaluated based on the Hall voltage $V_y$. FIG. 12 is a chart showing a result obtained by evaluating the conversion efficiency $\theta_{J_sJ_c}$ from the spin current to the electric current in each of the samples S1 to S4.

<Consideration>

In the comparison of FIG. 9 with FIG. 12, $\theta_{J_cJ_s}$ and $\theta_{J_sJ_c}$ are almost equal in the samples S1, S2, and S4. This means that the conversion from the electric current to the spin current and the conversion from the spin current to the electric current are reciprocal to each other. This result matches a feature of a spin current generation phenomenon derived from the SOI in the related art. On the other hand, $\theta_{J_cJ_s}$ is about 9.75 times higher than $\theta_{J_sJ_c}$ in the sample S3. This means that the conversion from the electric current to the spin current and the conversion from the spin current to the electric current are non-reciprocal to each other. In the above example, the generation of the direct spin current in the stacking structure of copper and copper oxide was proved by using the USMR. Non-Patent Document 6 describes that the generation of the alternating spin current in the stacking structure of copper and copper oxide is caused by bulk SHE. This is because the Rashba effect obtained by the experiment is much larger than the value known for the metal. Indeed, an experiment has shown that the SOI of surface copper oxide is substantially equal to the SOI of Au and is about a quarter of the SOI of Pt. However, the results shown in FIGS. 9 and 12 suggest that the spin currents generated in the surface copper oxides do not follow reciprocal SOI and are caused by the non-reciprocal mechanism.

Spin-vorticity coupling (SVC) is considered as one possible non-reciprocal spin current generation mechanism. The SVC is an action of converting macroscopic angular momentum caused by mechanical rotation into microscopic spin angular momentum. In particular, mechanical rotation of a solid or a liquid can be a source of the spin accumulation. In reality, the generation of the spin current due to the SVC is realized by using a turbulent flow of liquid mercury and the Rayleigh wave on the surface of the Cu film (see FIG. 4). In these systems, a vorticity field caused by the movement of a lattice influences the electron spin as an effective magnetic field, and the spin current is generated along a gradient of the vorticity by the SVC. Even in the surface copper oxide having a large gradient of the carrier mobility in the thickness direction, the electric current generates the gradient of the vorticity and generates the spin current.

FIGS. 13 and 14 are diagrams conceptually showing a scene of mutual conversion between the electric current and the spin current. Part (a) of FIG. 13 shows a scene of the conversion of the electric current $J_c$ to the spin current $J_s$ in the Pt layer of the sample S1. Part (b) of FIG. 13 shows a scene of the conversion of the spin current $J_s$ to the electric current $J_c$ in the Pt layer of the sample S1. Part (a) of FIG. 14 shows a scene of the conversion of the electric current $J_c$ to the spin current $J_s$ in the Cu layer and the $Cu_2O$ layer of the sample S3 (particularly, the boundary region between these layers). Part (b) of FIG. 14 shows a scene of the conversion of the spin current $J_s$ to the electric current $J_c$ in the Cu layer and the $Cu_2O$ layer of the sample S3. In the figure, S represents the electron spin. A magnitude of an arrow of the electric current $J_c$ indicates the moving velocity of the electron. A circular arrow shown in part (a) of FIG. 14 represents a vorticity V of a flow of the electrons (that is, the rotation of the velocity field of the electron).

A distribution of the moving velocities of the electrons becomes spatially non-uniform due to the non-uniform mobility in the boundary region between the Cu layer and the $Cu_2O$ layer, and thus, the vorticity V shown in part (a) of FIG. 14 is generated. Thus, the electric current $J_c$ is converted into the spin current $J_s$ along the vorticity gradient through the SVC. As shown in part (b) of FIG. 14, even though the spin current $J_s$ is injected into the boundary region between the Cu layer and the $Cu_2O$ layer in parallel with the gradient of the mobility, since the vorticity V of the flow of the electrons is not generated, the spin current $J_s$ is not converted into the electric current $J_c$.

FIG. 15 is a diagram showing a schematic model of a layer structure of the sample S3. As described above, the sample S3 has the Cu layer provided on the NiFe layer and the $Cu_2O$ layer provided on the Cu layer. In this model, the thickness of the Cu layer is 4 nm, and the thickness of the $Cu_2O$ layer including the boundary region is 6 nm. In FIG. 15, a graph showing the change in the mobility in the thickness direction (z direction) is also shown. As is clear from the graph, a mobility $\mu_{Cu2O}$ of the $Cu_2O$ layer is lower than a mobility $\mu_{Cu}$ of the Cu layer. In the boundary region between the Cu layer and the $Cu_2O$ layer, the mobility changes continuously. A thickness D of the boundary region is, for example, less than 6 nm. Such continuous change in the mobility is caused by mutual diffusion between Cu atoms and O atoms. Here, assuming that the mobility changes smoothly in the thickness direction (z direction), $\mu(z)$ is expressed as follows.

$$\mu(z) \approx \frac{\mu_{Cu} - \mu_{Cu_2O}}{2}\left[1 - \tanh\left(\frac{z}{L}\right)\right] \quad \text{[Formula 1]}$$

Here, the conversion efficiency $\theta_{JcJs}$ is given by the following Equation (1).

[Formula 2]
$$\theta_{JcJs} \approx 0.051\frac{l^2}{L^2} \quad (1)$$

However, l is the mean free path of the electrons in copper, and L=D/2. It is assumed that the $Cu_2O$ layer above the boundary region is an ideal insulator.

As is clear from Equation (1), as L becomes smaller (that is, as the boundary region becomes thinner), the larger conversion efficiency $\theta_{JcJs}$ can be obtained. For example, when L=3 nm and l=2.8 nm which are typical values of copper at room temperature, the conversion efficiency $\theta_{JcJs}$ is 0.044.

As described above, in the region having the change in the mobility, the spin current is generated by the conversion of the vorticity (that is, the rotation of the velocity field of the electron) into the angular momentum in the flow of the electrons. Such a spin current generation method does not require the ferromagnetic material or the material having large SOI, and can increase a degree of freedom in material selection of the spintronics device.

Second Embodiment

FIG. 16 is a perspective view showing a configuration of a magnetic memory 30 according to a second embodiment of the present disclosure. The magnetic memory 30 is a magnetic random access memory and includes the device 1 according to the first embodiment. Specifically, the magnetic memory 30 includes storage elements (memory cells) $M_{1,1}$ to $M_{I,J}$ arranged in a matrix in a row direction (s direction) and a column direction (t direction). The storage elements $M_{i,j}$, $M_{i,(j+1)}$, $M_{(i+1),j}$, and $M_{(i+1),(j+1)}$ are shown in the figure as representatives (i=1, 2, . . . , I–1, j=1, 2, . . . , J–1).

Part (a) of FIG. 17 is a cross-sectional view showing a configuration of the storage element $M_{i,j}$. The storage element $M_{i,j}$ is a giant magnetoresistive (GMR) element or a tunnel magnetoresistive (TMR) element, and includes a first ferromagnetic layer (fixed layer) 31, a non-magnetic layer 32 provided on the ferromagnetic layer 31, a second ferromagnetic layer (free layer) 33 provided on the non-magnetic layer 32, and the device 1 provided on the ferromagnetic layer 33. The device 1 has the same configuration as that of the first embodiment. That is, the device 1 includes a conductive layer 2 provided on the ferromagnetic layer 33, a conductive layer 3 provided on the conductive layer 2, and a boundary region formed between the conductive layers 2 and 3. The configurations of the conductive layers 2 and 3 are the same as those of the first embodiment, and the mobility of the conductive layer 3 is lower than the mobility of the conductive layer 2. The boundary region between the conductive layer 2 and the conductive layer 3 has the gradient of the mobility in the stacking direction. The spin current is generated in the device 1 by the rotation of the velocity field of the electron caused by this gradient of the mobility. A pair of electrodes 35 and 36 are arranged on the conductive layer 2. The electrodes 35 and 36 are arranged at an interval from each other. An electrode 37 is fabricated below the ferromagnetic layer 31.

The other storage elements $M_{i,(j+1)}$, $M_{(i+1),j}$, and $M_{(i+1),(j+1)}$ shown in FIG. 16 are also the GMR elements or the TMR elements having the same configuration as that of the storage element $M_{i,j}$ shown in part (a) of FIG. 17.

Information corresponding to directions of relative magnetizations $M_1$ and $M_2$ of the ferromagnetic layers 31 and 33 is stored in the storage element $M_{i,j}$ shown in part (a) of FIG. 17. For example, NiFe is adopted as materials of the ferromagnetic layers 31 and 33. The ferromagnetic layers 31 and 33 may be made of materials different from each other or may be made of the same material. The magnetization $M_1$ of the ferromagnetic layer 31 is fixed, and the magnetization $M_2$ of the ferromagnetic layer 33 is variable. In addition to non-magnetic metal such as Cu, an insulator such as aluminum oxide ($Al_2O_3$) or magnesium oxide (MgO) can also be used as a material of the non-magnetic layer 32.

Referring back to FIG. 16, the description is continued. A word line $WL_j$ is provided on a j-th row, and a word line $WL_{j+1}$ is provided on a (j+1)-th row. Three bit lines $BLA_i$, $BLB_i$, and $BLC_i$ are provided in an i-th column, and three bit lines $BLA_{i+1}$, $BLB_{i+1}$, and $BLC_{i+1}$ are provided in an (i+1)-th column. As stated above, at least one word line is provided for each row, and at least three bit lines are provided for each column. A pair of selective transistors STA and STB are connected to each of the storage elements $M_{i,j}$, $M_{i,(j+1)}$, $M_{(i+1),j}$, and $M_{(i+1),(j+1)}$. One current terminal of the selective transistor STA is connected to the electrode 35, and one current terminal of the selection transistor STB is connected to the electrode 36. The other current terminals of the selective transistors STA and STB connected to the storage elements $M_{i,j}$ and $M_{i,(j+1)}$ in the i-th column are connected to the bit lines $BLA_i$ and $BLB_i$, respectively. The other current terminals of the selective transistors STA and STB connected to the storage elements $M_{(i+1),j}$ and $M_{(i+1),(j+1)}$ in the (i+1)-th column are connected to the bit lines $BLA_{i+1}$ and $BLB_{i+1}$, respectively. Control terminals of the selective transistors STA and STB connected to the storage elements $M_{i,j}$ and $M_{(i+1),j}$ in the j-th row are connected to the word line $WL_j$. Control terminals of the selective transistors STA and STB connected to the storage elements $M_{i,(j+1)}$ and $M_{(i+1),(j+1)}$ in the (j+1)-th row are connected to the word lines $WL_{j+1}$.

The electrodes 37 of the storage elements $M_{i,j}$ and $M_{i,(j+1)}$ in the i-th column are connected to the bit line $BLC_i$. The electrodes 37 of the storage elements $M_{(i+1),j}$ and $M_{(i+1),(j+1)}$ in the (i+1)-th column are connected to the bit line $BLC_{i+1}$. The word lines $WL_j$ and $WL_{j+1}$ and the bit lines $BLA_i$, $BLA_{i+1}$, $BLB_i$, $BLB_{i+1}$, $BLC_i$, and $BLC_{i+1}$ are connected to control circuits (not shown).

When writing is performed in the storage elements $M_{i,j}$, $M_{i,(j+1)}$, $M_{(i+1),j}$, and $M_{(i+1),(j+1)}$, the spin current $J_s$ is generated in the device 1 of the storage element $M_{i,j}$ by turning on the selective transistors STA and STB of the row through the word line $WL_j$ corresponding to the selected storage element (here, storage element $M_{i,j}$) and causing the electric current to flow between the electrodes 35 and 36 through the bit lines $BLA_i$ and $BLB_i$ of the column. This spin current $J_s$ interacts with the magnetization $M_2$ of the ferromagnetic layer 33, and the spin angular momentum is transferred to the magnetization $M_2$. As a result, the magnetization $M_2$ of the ferromagnetic layer 33 is reversed.

The storage elements $M_{i,j}$, $M_{i,(j+1)}$, $M_{(i+1),j}$, and $M_{(i+1),(j+1)}$ read out information by using the GMR effect or the TMR effect. That is, the selective transistors STA and STB of the row are turned on through the word line $WL_j$ corresponding to the selected storage element (here, storage element $M_{i,j}$), and the electric current flows between the electrodes 35 and 36 and the electrode 37 through the bit lines $BLA_i$, $BLB_i$, and $BLC_i$ of the column. As shown in part (a) of FIG. 17, when the magnetizations of the ferromagnetic layers 31 and 33 are in a parallel state, vertical current paths passing through the ferromagnetic layer 31, the non-magnetic layer 32, and the ferromagnetic layer 33 are relatively low resistance, and for example, "1" is read out via the bit lines $BLA_i$, $BLB_i$, and $BLC_i$. On the other hand, as shown in part (b) of FIG. 17, when the direction of magnetization of the ferromagnetic layer 33 is reversed and the magnetizations of the ferromagnetic layers 31 and 33 are in an antiparallel state, vertical current paths passing through the ferromagnetic layer 31, the non-magnetic layer 32, and the ferromagnetic layer 33 are relatively high resistance, and for example, "0" is read out via the bit lines $BLA_i$, $BLB_i$, and $BLC_i$.

In accordance with the magnetic memory 30 according to the present embodiment, the spin current is generated by the device 1 capable of generating the spin current without depending on the specific material, and this spin current interacts with the magnetization of the ferromagnetic layer 33. Accordingly, the magnetization direction of the ferromagnetic layer 33 can be controlled.

The magnetic memory 30 of the present embodiment can be applied to various electronics devices. That is, the electronics device may have one or more magnetic memories 30 mounted thereon. As the electronics device, there are a memory board having a plurality of magnetic memories 30 mounted thereon, an electronic component having the plurality of magnetic memories 30 or memory boards mounted thereon, home appliances having the magnetic memory 30, the memory board, or the electronic component mounted thereon, and devices such as a personal computer, a smartphone, an in-vehicle device, a measurement device, and an electric device which require a memory.

In accordance with the magnetic memory 30 of the present embodiment, the following new effects can be obtained.

(1) Improvement of Electrical Conductance

The efficiency of the spin current generation due to the spin Hall effect derived from spin orbit interaction (SOI) is expressed by spin Hall conductance $\sigma_{SH}$. An electric current density is obtained by multiplying the voltage V by the electrical conductance $\sigma$ (Ohm's law), but a spin current density is similarly obtained by multiplying the voltage V by the spin Hall conductance $\sigma_{SH}$. The voltage V for generating the spin current required for performing bit rewriting in the magnetic memory decreases as the spin Hall conductance $\sigma_{SH}$ increases. Since the energy consumption of the bit rewriting is proportional to the square of the voltage V, as the spin Hall conductance $\sigma_{SH}$ becomes higher, the energy consumption of the bit rewriting can be reduced.

Here, FIG. 18 is a graph in which various materials are plotted according to the spin Hall conductance $\sigma_{SH}$ and the electrical conductance $\sigma$. In FIG. 18, a vertical axis represents a value obtained by dividing the spin Hall conductance $\sigma_{SH}$ by $h/(4\pi e)$ (where h is Planck's constant and e is the elementary charge) (unit: Siemens·m$^{-1}$), and a horizontal axis represents the electrical conductance $\sigma$ (unit: Siemens·m$^{-1}$). As shown in FIG. 18, in the metal such as Cu or Ag having high electrical conductance $\sigma$, the spin Hall conductance $\sigma_{SH}$ is generally low. The electrical conductance $\sigma$ of a topological insulator such as BiSb having large spin Hall conductance $\sigma_{SH}$ is low. When a material having low electrical conductance $\sigma$ is used as a spin current generation source of the magnetic memory, a wiring resistance of each bit of the magnetic memory becomes large. The delay and attenuation of a signal, the deformation of a signal waveform, an increase in power consumption, the radiation of an electromagnetic wave, or the like occurs, and thus, a high-speed and power-saving operation is hindered. On the other hand, in the present embodiment, the spin current is generated based on a completely new principle, and thus, a large spin current can be generated by using the material such as Al, Cu, or Ag having high electrical conductance $\sigma$ but low spin Hall conductance $\sigma_{SH}$ peculiar to the substance.

Part (a) of FIG. 19 is a diagram schematically showing an atomic structure near the conductive layers 2 and 3 and the boundary region 4. In the figure, a range $D_2$ corresponds to the conductive layer 2, a range $D_3$ corresponds to the conductive layer 3, and a range $D_4$ corresponds to the boundary region 4. In the figure, atoms 41 constituting the conductive layer 2 and atoms 42 constituting the conductive layer 3 are schematically shown. As shown in the figure, in the boundary region 4, the atoms 41 constituting the conductive layer 2 and the atoms 42 constituting the conductive layer 3 are mutually diffused. As a position becomes closer to the conductive layer 2, a proportion of the atoms 41 becomes larger, and as the position becomes closer to the conductive layer 3, a proportion of the atoms 42 becomes larger. Part (b) of FIG. 19 is a graph showing a change in the electrical conductance σ in the thickness direction, a horizontal axis shows the electrical conductance σ, and a vertical axis is the position in the thickness direction corresponding to part (a).

As shown in part (b) of FIG. 19, it is assumed that the electrical conductance σ is gradually changed from $\sigma_H$ (maximum electrical conductance) to $\sigma_L$ (minimum electrical conductance, $\sigma_H > \sigma_L$) in a region of the thickness D by oxidizing or nitriding the metal surface or giving a gradient to a composition at a boundary between different substances. Typically, the maximum electrical conductance $\sigma_H$ is the electrical conductance of the conductive layer 2, and the minimum electrical conductance $\sigma_L$ is the electrical conductance of the conductive layer 3. At this time, since the electrical conductance at a center of the boundary region 4 is given by an average value $(\sigma_H+\sigma_L)/2$ of the maximum electrical conductance $\sigma_H$ and the minimum electrical conductance $\sigma_L$, when $\sigma_H$ is sufficiently higher than $\sigma_L$, the electrical conductance can be approximated to $\sigma_H/2$. On the other hand, the spin Hall conductance $\sigma_{SH}$ of the spin current generated by an electric current vortex in the boundary region 4 is given by the following Equation (2) by theoretical calculation.

[Formula 3]

$$\sigma_{SH} = 0.05 \cdot \sigma_H \cdot \left(\frac{l}{L}\right)^2 \quad (2)$$

Here, l is the mean free path (collision distance) of the electrons flowing through the boundary region 4. L=D/2 (D is the thickness of the boundary region 4). As is clear from this equation, the spin Hall conductance $\sigma_{SH}$ of the boundary region 4 is proportional to $\sigma_H$. This indicates that a large spin current can be generated by using a substance having high electrical conductance σ regardless of the spin Hall conductance $\sigma_{SH}$ peculiar to various materials shown in FIG. 18. In the above Equation (2), the spin Hall conductance $\sigma_{SH}$ is inversely proportional to the square of L. That is, the spin Hall conductance $\sigma_{SH}$ is inversely proportional to the square of the thickness D of the boundary region 4. Accordingly, the thickness D is reduced, and thus, the efficiency of the spin current generation can be improved without changing the material system of the conductive layers 2 and 3. From the above, in accordance with the magnetic memory 30 of the present embodiment that generates the spin current by the rotation of the velocity field of the electron caused by the gradient of the boundary region 4 having the gradient of the electrical conductivity, the delay and attenuation of the signal, the deformation of the signal waveform, the increase in the power consumption, the radiation of the electromagnetic wave, and the like can be suppressed by significantly reducing the wiring resistance in each bit compared with the magnetic memory of the related art.

(2) Improvement of Magnetic Friction

FIG. 20 is a graph showing the conversion efficiency from the electric current to the spin current (marked with ○ in the figure) and the conversion efficiency (marked with □ in the figure) from the spin current to the electric current in the copper film (Cu*) with the oxide film formed on the surface and Pt. As shown in FIG. 20, unlike Pt, the inverse conversion from the spin current to the electric current hardly occurs in the copper film (Cu*). This is because the electric current vortex is not generated even though the spin current flows in a gradient direction of the electrical conductance σ in the boundary region 4.

As described above, the bit writing in the magnetic memory is performed by reversing the magnetic moment of the ferromagnetic layer 33. Friction (dissipation of energy to a crystal lattice) acts on the motion of the magnetic moment, and as the material has larger friction, it is difficult to change the direction of the magnetic moment. FIG. 21 is a graph showing a relationship between the Gilbert damping constant α representing a magnitude of this friction and the external magnetic field $\mu_0 H$. In FIG. 21, a horizontal axis represents the external magnetic field $\mu_0 H$ (unit: mT), and a vertical axis represents the Gilbert damping constant α.

Referring to FIG. 21, in the case of ferromagnetic NiFe alone, the Gilbert damping constant α is a constant value (about 0.008) regardless of the magnetic field, but when Pt is joined to NiFe, the Gilbert damping constant increases to about twice this value. This is because when the direction of the magnetic moment of NiFe changes, the spin current flows out to Pt as a counteraction, the spin current is converted into the electric current in Pt (inverse spin Hall effect), and Joule heat is generated (that is, energy dissipates). In the spin injection type magnetic memory of the related art, since the bit writing is performed by injecting the spin current generated in Pt into the ferromagnetic layer, it is necessary to join Pt to the ferromagnetic layer. At this time, since the friction acting on the magnetic moment of the ferromagnetic layer increases, it is difficult to perform the writing. As the material has larger spin current generation efficiency, the Gilbert damping constant α of the ferromagnetic layer which is a joining partner becomes larger. Thus, the efficiency of the bit writing deteriorates. On the other hand, in accordance with the method of the present embodiment of generating the spin current by the gradient of the electrical conductivity in the boundary region 4, since the inverse conversion from the spin current to the electric current hardly occurs as described above, the Gilbert damping constant α of the ferromagnetic layer is not increased practically. This is clear from the fact that in FIG. 21, when a copper thin film (Cu*) having an oxidized surface is joined to the NiFe layer, the Gilbert damping constant α of NiFe hardly increases.

From the above, in accordance with the magnetic memory 30 of the present embodiment, it is possible to significantly reduce the magnetic friction when the magnetic moment of the ferromagnetic layer 33 is reversed. Accordingly, spin current intensity required for the bit writing can be further decreased.

The energy consumption at the time of bit rewriting in the spin transfer torque type magnetic memory (STT-MRAM) of the related art is several hundreds of femtojoules (fJ), and the energy consumption at the time of bit rewriting in the improved spin orbit torque type magnetic memory (SOT-MRAM) is 1/20 or less of that of the STT-MRAM. However, in accordance with the magnetic memory 30 of this embodiment, the energy consumption at the time of bit rewriting can be further reduced to 1/10 or less of that of the SOT-MRAM. In the magnetic memory 30 of the present embodiment, a configuration of each bit is the same as that of the SOT-MRAM, and a size of each bit can be significantly further decreased (for example, $40F^2$) than that of the STT-MRAM ($80F^2$). F is a minimum feature size. A data write time can be significantly further decreased (for example, 1 ns or less) than that of the STT-MRAM (10 ns), and a cycle life of data rewriting is significantly further increased (for example, $10^{15}$ times) than that of the STT-MRAM ($10^{12}$ times).

Modification Example

Although the spin current is generated by using the gradient of the carrier mobility or the electrical conductivity in the boundary region 4 present between the conductive layer 2 and the conductive layer 3 in the above-described embodiments, the spin current can be generated by the change even when the thickness of the boundary region 4 is close to 0 as possible (that is, the boundary region 4 is not present and the carrier mobility or the electrical conductivity changes discontinuously).

FIG. 22 is a perspective view showing a configuration of a spintronics device 1A according to the present modification example. The device 1A includes a conductive layer 2 (first conductive layer) and a conductive layer 3 (second conductive layer). The constituent materials, mobility (electrical conductivity), and thickness of the conductive layers 2 and 3 are the same as those in the first embodiment. However, in the present modification example, the thickness of the boundary region is close to 0 as possible or is not present. Accordingly, the conductive layers 2 and 3 are in contact with each other.

FIG. 23 is a graph showing the change in mobility of device 1A in the stacking direction. In FIG. 23, a range $D_2$ corresponds to the conductive layer 2 and a range $D_3$ corresponds to the conductive layer 3. Similar to the first embodiment, a mobility $\mu_3$ of the material constituting the conductive layer 3 is lower than a mobility $\mu_2$ of the material constituting the conductive layer 2. In the present modification example, since the conductive layers 2 and 3 are in contact with each other (there is no boundary region), the mobility changes discontinuously (stepwisely) at an interface of the conductive layers 2 and 3.

FIG. 24 is a schematic diagram showing velocities of electrons moving inside the device 1A when a voltage is applied in a direction intersecting a stacking direction. Arrows $A_2$ and $A_3$ in the figure indicate the movement of electrons in the conductive layers 2 and 3, respectively. A length of each of arrow $A_2$ and $A_3$ represents a moving velocity of the electron. As the arrow becomes longer, the moving velocity of the electron becomes higher.

The moving velocities of the electrons moving in the conductive layer 2 having high mobility are faster than the moving velocities of the electrons moving in the conductive layer 3 having low mobility. Accordingly, arrow $A_2$ is longer than arrow $A_3$. Due to such a difference between the moving velocities of the electrons, a velocity field of the electron rotates at the interface between the conductive layers 2 and 3 (arrow Ar in FIG. 24). Due to the rotation Ar of this velocity field, angular momentum is present in a flow of the electrons. This angular momentum is converted into an electron spin (upspin or downspin) in one direction. Accordingly, the equilibrium state between the upspins and the downspins is disturbed, and a relative distribution of the upspins and the downspins is biased. As a result, a spin current is generated in a direction in which the bias of the distribution is eliminated (that is, a direction from the interface toward the conductive layer 2).

In the device 1A of the present modification example, a large spin current can be generated as in the first embodiment. This action is exhibited by merely discontinuously changing the carrier mobility or the electrical conductivity, and a special material such as precious metal that causes the SOI is not required. Accordingly, a degree of freedom in material selection of the spintronics device can be increased.

The device 1 of the second embodiment described above may be replaced with the device 1A of the present modification example. In that case, the spin current is generated by the device 1A capable of generating the spin current without depending on the specific material, and this spin current interacts with the magnetization of the ferromagnetic layer 33. Accordingly, the magnetization direction of the ferromagnetic layer 33 can be controlled.

The spintronics device, the magnetic memory, and the electronics device according to the present invention are not limited to the above-described embodiments, and various other modifications can be made. For example, although Cu and Al are used as the examples of the constituent materials of the first conductive layer and the oxide thereof is used as the example of the constituent material of the second conductive layer in the above embodiments, the first conductive layer may be another metal other than Cu and Al, and the second conductive layer may be an oxide thereof. Alternatively, the constituent material of the first conductive layer may be one or more metals selected from the metal group containing Cu and Al, and the second conductive layer may be another kind of material other than the oxide thereof. Alternatively, the first conductive layer may be made of a semiconductor and the second conductive layer may be made of an insulator. As stated above, materials having conductivity such as conductive organic substances, conductive oxides, conductive nitrides, and the like can be all targets of the first and second conductive layers.

Although the preferred embodiments of the present invention have been described in detail, the present invention is not limited to such a specific embodiment. That is, only a part of a plurality of examples related to the present invention is merely described, and it need scarcely be said that various modifications and changes can be made even though the examples are not directly described as long as the object, problem, or effect of the present invention can be achieved. In particular, combinations of a plurality of components or functions described in the examples can be changed (added or deleted).

Although the problem and the object of the present invention are comprehensively described in "Technical Problem", the present invention is not limited thereto. It need scarcely be said that the problems and the objects described in the examples are also valid for inventions thereof. Since the effects described in the examples are contrary to the problems or the objects, the presence thereof should be understood even though the problems or the objects are not directly described therein.

Although the inventions for achieving the problems or the objects are described in the examples, a degree of achievement does not necessarily be 100%, and varies depending on the combination of the configurations of the inventions. For example, it need scarcely be said that the invention should not be denied as having not achieved the object even with a degree of achievement of 10%.

(Additional Remarks)

With regard to the fact that the spin current can be generated by the region having the gradient of the electrical conductivity described in the first embodiment, the following experimental results also provide a clear basis. FIG. 25 is a graph showing a relationship between spin current intensity and an oxidation time in a copper thin film having an oxidized surface. In FIG. 25, a horizontal axis represents the oxidation time (unit: seconds), and a vertical axis represents an amount $\Delta R/R$ proportional to the spin current intensity. That is, R represents electrical resistance measured under a condition in which the generation of the spin current can be ignored, and $\Delta R$ represents the amount of change in the electrical resistance due to the generation of the spin current. Accordingly, ΔR/R represents a rate of change in the electrical resistance due to the generation of the spin current. As is clear from FIG. 25, the spin current intensity (spin current amount) becomes maximum at an oxidation time of around 6000 seconds, and when the oxidation further progresses, as the oxidation time becomes longer, the spin current intensity gradually decreases. If the copper oxide itself acquires the ability to generate the spin current, the spin current intensity should increase as the oxidation progresses. In general, in the oxidation procedure of the substance, "oxygen adsorption on a surface" first occurs, oxygen sufficiently adsorbs onto the entire surface, and then "progression of diffusion of oxygen atoms into substance" occurs.

Part (a) of FIG. 26 is a graph showing a relationship between the distribution of oxygen atoms in a depth direction and the oxidation time. Part (b) of FIG. 26 is a graph showing a relationship between the distribution of the electrical conductance of the copper thin film in the depth direction and the oxidation time. In these figures, a horizontal axis represents a depth (unit: nm), a vertical axis in part (a) represents an oxygen atom density, and a vertical axis in part (b) represents a normalized value of the electrical conductance (obtained by dividing the electrical conductance of the copper thin film in each depth by the electrical conductance of oxygen-free copper). In these figures, graphs G31 and G41 show a case where the oxidation time is 600 seconds, graphs G32 and G42 show a case where the oxidation time is 6000 seconds, and graphs G33 and G43 show a case where the oxidation time is 12000 seconds.

As is clear from FIG. 26, when the oxidation time is short, a decrease in the electrical conductance due to the oxidation on the copper surface is slight, and a difference ($\sigma_H - \sigma_L$) between the maximum electrical conductance $\sigma_H$ and the minimum electrical conductance $\sigma_L$ is small. Thus, an inclination gradient of the electrical conductance $\sigma$ is small. The inclination gradient of the electrical conductance $\sigma$ increases as the oxidation progresses, but since oxygen diffusion into the copper progresses after oxygen sufficiently adsorbs onto the copper surface, the inclination gradient starts to decrease. As stated above, since the tendency of a change in the inclination gradient of the electrical conductance $\sigma$ caused by the oxidation time and the tendency of a change in the spin current intensity caused by the oxidation time shown in FIG. 26 match each other, these tendencies strongly suggest that the electric current vortex generates the spin current in the region having the gradient of the electrical conductivity.

REFERENCE SIGNS LIST 1 spintronics device
2, 3 conductive layer
4 boundary region
20 Hall bar
21 first layer
22 second layer
23 lock-in amplifier
25 voltmeter
30 magnetic memory
31, 33 ferromagnetic layer
32 non-magnetic layer
35, 36, 37 electrode
102 metal coating
102a surface
$H_{dc}$ external magnetic field
$J_c$ current
$J_s$ spin current
Q lattice point
S1 to S4 sample
V vorticity.

The invention claimed is:

1. A spintronics device comprising:
a region having a gradient of carrier mobility or electrical conductivity, wherein
a spin current is generated by rotation of a velocity field of an electron caused by the gradient.

2. The spintronics device according to claim 1, further comprising:
a first conductive layer; and
a second conductive layer having carrier mobility or electrical conductivity lower than the carrier mobility or electrical conductivity of the first conductive layer, wherein
the region is a boundary region between the first conductive layer and the second conductive layer.

3. The spintronics device according to claim 2, wherein a ferromagnetic layer adjacent to the first conductive layer is not provided.

4. The spintronics device according to claim 2, wherein the second conductive layer contains an oxide of a material constituting the first conductive layer.

5. The spintronics device according to claim 4, wherein the first conductive layer mainly contains copper, and the second conductive layer mainly contains copper oxide.

6. The spintronics device according to claim 2, wherein the second conductive layer is made of another material except for an oxide of a material constituting the first conductive layer.

7. The spintronics device according to claim 1, wherein the spin current is generated by angular momentum due to the rotation of the velocity field of the electron.

8. A spintronics device comprising:
a first conductive layer; and
a second conductive layer having carrier mobility or electrical conductivity lower than the carrier mobility or electrical conductivity of the first conductive layer, wherein
a spin current is generated by rotation of a velocity field of an electron caused by a change in carrier mobility or electrical conductivity at a boundary between the first conductive layer and the second conductive layer.

9. A magnetic memory comprising:
a first ferromagnetic layer;
a non-magnetic layer provided on the first ferromagnetic layer;
a second ferromagnetic layer provided on the non-magnetic layer;
a first conductive layer provided on the second ferromagnetic layer; and
a second conductive layer having carrier mobility or electrical conductivity lower than the carrier mobility or electrical conductivity of the first conductive layer and provided on the first conductive layer, wherein
a boundary region between the first conductive layer and the second conductive layer has a gradient of carrier mobility or electrical conductivity in a stacking direction,
a spin current is generated by rotation of a velocity field of an electron caused by the gradient, and
information is stored by controlling a direction of magnetization of the second ferromagnetic layer by using the spin current.

10. A magnetic memory comprising:
a first ferromagnetic layer;
a non-magnetic layer provided on the first ferromagnetic layer;
a second ferromagnetic layer provided on the non-magnetic layer;
a first conductive layer provided on the second ferromagnetic layer; and
a second conductive layer having carrier mobility or electrical conductivity lower than the carrier mobility or electrical conductivity of the first conductive layer and provided on the first conductive layer, wherein
a spin current is generated by rotation of a velocity field of an electron caused by a change in carrier mobility or electrical conductivity at a boundary between the first conductive layer and the second conductive layer, and
information is stored by controlling a direction of magnetization of the second ferromagnetic layer by using the spin current.

11. An electronics device having one or more of the magnetic memories according to claim 9 mounted thereon.

12. The spintronics device according to claim 3, wherein the second conductive layer contains an oxide of a material constituting the first conductive layer.

13. The spintronics device according to claim 3, wherein the second conductive layer is made of another material except for an oxide of a material constituting the first conductive layer.

14. The spintronics device according to claim 2, wherein the spin current is generated by angular momentum due to the rotation of the velocity field of the electron.

15. The spintronics device according to claim 3, wherein the spin current is generated by angular momentum due to the rotation of the velocity field of the electron.

16. The spintronics device according to claim 4, wherein the spin current is generated by angular momentum due to the rotation of the velocity field of the electron.

17. The spintronics device according to claim 5, wherein the spin current is generated by angular momentum due to the rotation of the velocity field of the electron.

18. The spintronics device according to claim 6, wherein the spin current is generated by angular momentum due to the rotation of the velocity field of the electron.

19. The spintronics device according to claim 12, wherein the spin current is generated by angular momentum due to the rotation of the velocity field of the electron.

20. An electronics device having one or more of the magnetic memories according to claim 10 mounted thereon.

21. The spintronics device according to claim 2, wherein a constituent material of the first conductive layer and a constituent material of the second conductive layer are mixed in the boundary region.

22. The spintronics device according to claim 2, wherein a proportion of a constituent material of the first conductive layer becomes larger in the boundary region closer to an interface with the first conductive layer, and a proportion of a constituent material of the second conductive layer becomes larger in the boundary region closer to an interface with the second conductive layer.

23. The spintronics device according to claim 2, wherein a constituent material of the first conductive layer mainly contains one or more metals selected from a metal group consisting of Cu and Al, and the second conductive layer is made of material except for an oxide of the one or more metals.

24. The spintronics device according to claim 2, wherein a constituent material of the first conductive layer mainly contains Al, and the second conductive layer is made of another material except for an oxide of Al.

25. A magnetic memory comprising the spintronics device according to claim 1.

26. A magnetic memory comprising the spintronics device according to claim 21.

27. A magnetic memory comprising the spintronics device according to claim 22.

28. A magnetic memory comprising the spintronics device according to claim 23.

29. A magnetic memory comprising the spintronics device according to claim 24.

30. An electronics device comprising the magnetic memory according to claim 25 mounted thereon.

31. An electronics device comprising the magnetic memory according to claim 26 mounted thereon.

32. An electronics device comprising the magnetic memory according to claim 27 mounted thereon.

33. An electronics device comprising the magnetic memory according to claim 28 mounted thereon.

34. An electronics device comprising the magnetic memory according to claim 29 mounted thereon.

* * * * *